United States Patent
Wilches Bernal et al.

(10) Patent No.: US 12,366,598 B1
(45) Date of Patent: Jul. 22, 2025

(54) DYNAMIC MODE DECOMPOSITION SYSTEMS AND METHODS TO DETECT POWER QUALITY EVENTS

(71) Applicant: National Technology & Engineering Solutions of Sandia, LLC, Albuquerque, NM (US)

(72) Inventors: Felipe Wilches Bernal, Thornton, CO (US); Matthew J. Reno, Albuquerque, NM (US); Javier Hernandez Alvidrez, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/864,990

(22) Filed: Jul. 14, 2022

Related U.S. Application Data

(60) Provisional application No. 63/221,722, filed on Jul. 14, 2021.

(51) Int. Cl.
  *G01R 31/08* (2020.01)
  *G06F 17/16* (2006.01)
(52) U.S. Cl.
  CPC ......... *G01R 31/088* (2013.01); *G01R 31/086* (2013.01); *G06F 17/16* (2013.01)
(58) Field of Classification Search
  None
  See application file for complete search history.

(56) References Cited

U.S. PATENT DOCUMENTS

2016/0084889 A1* 3/2016 Mezic .................. G05F 1/66
  702/60

OTHER PUBLICATIONS

Y. Susuki and I. Mezić, "Nonlinear Koopman Modes and Power System Stability Assessment Without Models," in IEEE Transactions on Power Systems, vol. 29, No. 2, pp. 899-907, Mar. 2014, doi: 10.1109/TPWRS.2013.2287235. (Year: 2014).*

* cited by examiner

*Primary Examiner* — Catherine T. Rastovski
*Assistant Examiner* — Brian Butler Geiss
(74) *Attorney, Agent, or Firm* — Daniel J. Jenkins

(57) ABSTRACT

Systems and methods for new systems and methods for detecting power quality disturbances, such as faults. The approach is based on the dynamic mode decomposition (DMD)—a data-driven method to estimate linear dynamics whose eigenvalues and eigenvectors approximate those of the Koopman operator. The approach uses the real part of the main eigenvalue estimated by the DMD as the key indicator that a power quality event has occurred. The disclosed systems and methods can be used to detect events using current and voltage signals to distinguish different faults. Because the proposed method is window-based, the effect that the window size has on the performance of the approach is analyzed.

19 Claims, 16 Drawing Sheets

DYNAMIC MODE DECOMPOSITION SYSTEMS AND METHODS TO DETECT POWER QUALITY EVENTS

CROSS-REFERENCE TO RELATED APPLICATION

This application claims the benefit of U.S. Provisional Application No. 63/221,722, filed Jul. 14, 2021, entitled "Dynamic Mode Decomposition Systems and Methods to Detect Power Quality Events," which is incorporated herein by reference.

GOVERNMENT INTEREST STATEMENT

This invention was made with Government support under Contract No. DE-NA0003525 awarded by the United States Department of Energy/National Nuclear Security Administration. The U.S. Government has certain rights in this invention.

FIELD OF THE INVENTION

The present invention is directed to electric power monitoring, and more particularly to detecting power system disturbance events

BACKGROUND OF THE INVENTION

As the power system mechanical inertia and stiffness decrease with the growing number of inverter-based energy resources on the grid, the electric grid experiences more variations that impact the power quality (PQ) of the system. Without inertia, PQ events are more likely to cause system instability with faster transients and larger magnitudes. These PQ events are generally caused at a certain location, such as a fault, solar irradiance variability, load harmonics, or inrush current, and there has been significant interest in detecting the cause and location of the PQ event to quickly diagnose if the event is going to be damaging or allowable. There has also been increasing computational power that has allowed sensors to process more data and provide much higher sampling rates in the MHz range. With the increasing interest and higher sampling rates, throughout the years, many methods have been used to analyze power system signals with PQ events.

Even though the study of power quality events is becoming more relevant nowadays due to the increase in the installation of inverter-based devices, this phenomenon is not new and has been studied before. For this reason, several approaches have been proposed to analyze distorted power system signals. A popular method for analyzing power quality events is the wavelet transform (WT) method. The WT method is a particularly powerful tool because it allows the analysis of signals in both frequency and the time domains. This method has also been used extensively for fault location in power systems. The results of WT-based approaches are dependent on the tuning selections of the parameters of the WT, specifically the mother wavelet and the level of decomposition. The optimal selection of those is still a matter of active research.

Another method that has been proposed for the study of PQ events is mathematical morphology (MM). This method has the advantage of being computationally efficient and is based on the MM theory developed in the sixties for the analysis of binary images. The results of methods based on MM are dependent on the selection of the structuring element and the particular operation under consideration, both of which continue to be investigated for optimal results depending on the application. Although somewhat less popular methods based on Kalman filters (KF), empirical mode decomposition (EMD), the Teager Kaiser energy operator (TKEO), and principal component analysis (PCA), have among others been proposed. These methods tend to be either more affected by noise or have not been fully tested against it (e.g., the TKEO methods).

What is needed are systems and methods that overcome the deficiencies of the known systems and methods and that can accurately and swiftly detect power system signal quality events.

Other features and advantages of the present invention will be apparent from the following more detailed description of the preferred embodiment, taken in conjunction with the accompanying drawings which illustrate, by way of example, the principles of the invention.

SUMMARY OF THE DISCLOSURE

The present disclosure is directed to systems and methods that detect power systems disturbances from power system signals. The approach is a window-based method that computes an eigen-representation (i.e., eigenvalues and eigenvectors) of the window of data. The data may be voltages and/or currents of a specific location in a power system. This eigen-representation is widely different for windows that contain power quality events and is used to detect them. The approach used to compute this eigen-representation is based on the dynamic mode decomposition. Regardless of the number of eigenvalues and eigenvectors to be estimated, the window size is a user definable parameter.

According to an embodiment of the disclosure, a method for detecting a power quality disturbance is disclosed that includes monitoring a power signal; receiving a new data point from a monitored signal; computing the dynamic mode decomposition of a window of the new data point where the new data point is included in the window and the oldest data point is discarded thereby keeping the window size constant; obtaining a real-part of eigenvalues from the dynamic mode decomposition; comparing values of the real-part against a pre-specified threshold and if they meet a set of predetermined criteria then determine an existence of a power quality disturbance; and indicating to a user the power quality disturbance.

According to another embodiment of the disclosure, a system for detecting a power quality disturbance is disclosed that includes a monitoring circuit electrically connected to an electrical power transmission that receives data points from a time period of data point windows from the electrical power transmission; a processor connected to the monitoring circuit that receives the data points, wherein the processor executes commands stored on a non-transitory medium that performs the following steps:
  computing the dynamic mode decomposition of a window of the new data point where the new data point is included in the window and the oldest data point is discarded thereby keeping the window size constant;
  obtaining a real-part of eigenvalues from the dynamic mode decomposition;
  comparing values of the real-part against a pre-specified threshold and if they meet a set of predetermined criteria then determine an existence of a power quality disturbance; and indicating to a user the power quality disturbance.

BRIEF DESCRIPTION OF THE DRAWINGS

The application will become more fully understood from the following detailed description, taken in conjunction with the accompanying figures, wherein like reference numerals refer to like elements, in which.

DETAILED DESCRIPTION OF THE INVENTION

Figure 1:
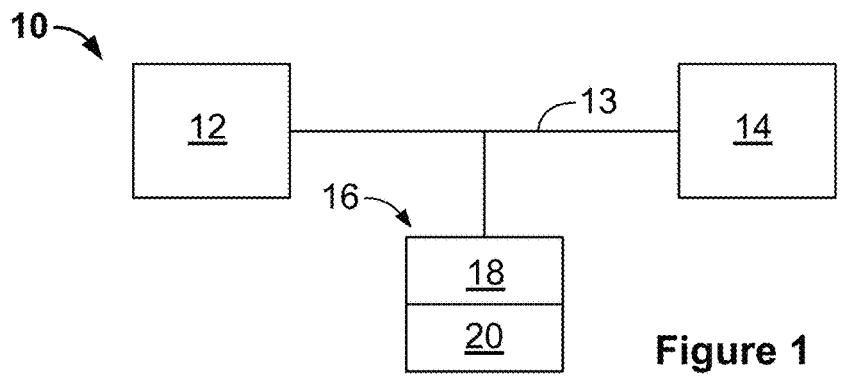
FIG. 1 is a schematic of power quality event detection system according to an embodiment of the disclosure.

The present disclosure provides new systems and methods that use dynamic mode decomposition (DMD) to estimate linear dynamics from a given set of data computed from an eigen-representation of a window of monitored data. The eigen-representation is formed of eigenvalues and eigenvectors. Even though the output is a linear system, the process behind the data generation does not need to be linear. The output is a squared matrix and, in control theory, squared matrices describe the dynamics of linear systems. Note that the eigenvalues of this matrix is what it is ultimately used to parse the power system signals. In fact, DMD computes the best linear dynamics from the available data. DMD can be interpreted as a computation of the eigenvalues and eigenvectors of a linear model in a finite dimension that approximates the Koopman operator. This operator is an infinite-dimensional linear operator that can exactly capture the dynamics of a nonlinear system in a measurement space.

Upon detection of a disturbance, the systems and methods can initiate corrective actions. In an embodiment, the corrective action may be to isolate the location of the disturbance. In another embodiment, the correct action may be an immediate action for a catastrophic failure, such as opening a breaker to remove a fault, or a warning signal to inform the operator to fix an issue, such as by replacing a failing transformer.

The power system signal from which the initial data is taken may be from a power transmission in an energy system, such as signals generated from a micro or macro-electrical power grid, a power transmission in a power/load system such as a generator and motor/load, or may be from power system signals from locations with solar photovoltaic and other distributed energy resources.

The method for detecting a PQ disturbance includes the following steps:
   a) monitoring a power signal voltage or current at a specific location in a power system;
   b) receiving a first data point of current or voltage in a window of the monitored signal and continuing to receive data points to build a first data set of current or voltage in the window;
   c) receiving a new data point from a second window of the monitored signal and continuing to receive data points to build a second data set of current or voltage in the second window, the window size is kept constant;
   d) repeating step c) to create a specified number of consecutive data set windows;
   e) computing the dynamic mode decomposition (DMD) of the data set for each window;
   f) obtaining a real-part of eigenvalues from the DMD above;
   g) comparing the values of the real-part of eigenvalues against a pre-specified threshold and if they meet a set of predetermined criteria that determines yes or no to a PQ event such as the existence of a fault;
   h) indicating to a user if a PQ event or disturbance occurred; and
   i) taking a corrective action if a PQ event occurred.

The real-part of eigenvalues is affected by the presence of harmonics and usually exhibits large magnitudes when the power system signal is distorted. Note that for no faulted data, the real part of the eigenvalues should be zero.

As understood by one of ordinary skill in the art, a data point is selected as a "window" of data over a specified period of time or duration. The size of the window is dependent on the specific implementation of the approach and will depend on the sampling frequency of the input signal. In an embodiment, the time duration may be 16.6 milliseconds that corresponds to one cycle at 60 HZ.

The data point(s) may be voltage and/or current and may be selected in the window individually or simultaneously. In an embodiment, the voltage may be a three-phase signal, which means that the signals used as the input come from a three-phase bus and are hence three-phase signals. That is, instead of being one voltage, there are three voltages (from phases A, B, and C). In an embodiment, the voltage and current are captured simultaneously by using the monitoring device to capture both current and data information. The monitoring device captures/measures voltage and current measuring. For example, phasor measurement units (PMUs) capture voltage and current simultaneously.

The windows are selected continuously or discontinuously. Continuous selection means that the end of a first window is the beginning of the next or second window. Discontinuous selection means that an amount of time exists between window sampling.

According to the presently disclosed process, the eigenvalues detected by DMD are different in the cases where the input data contains a power quality disturbance from cases where it does not. This result is demonstrated for three-phase signals as shown in the Examples below. The result is then extended to single-phase inputs. The definition of "different" as used herein means that the window-based approach is able to detect distorted waveforms by using the differences of the real part of the main eigenvalue mentioned above. The Examples below show that the method is valid for noisy signals with SNR values up to 35 dB, show how the window size affects the performance of the proposed method, and compares the disclosed method against the WT and MM under different noise conditions.

According to another embodiment of the disclosure, a system for detecting a power quality disturbance is disclosed that includes a monitor electrically connected to an electrical power transmission; a processor connected to the monitor for executing commands that perform the disclosed methodology; and a user device. The processor receives a new data point from a monitored signal, computes the dynamic mode decomposition of a window of the new data point where the new data point is included in the window and the oldest data point is discarded thereby keeping the window size constant, obtains a real-part of eigenvalues from the dynamic mode decomposition above, compares the values of the real-part against a pre-specified threshold and if they meet a set of predetermined criteria then determine the existence of a fault, and indicates to a user the power quality disturbance.

FIG. 1 is a schematic of a PQ event detection system 10 according to an embodiment of the disclosure. As can be seen in FIG. 1, system 10 includes a power source 12 electrically connected to a load 14 via a transmission line 13. Electrically connected to the transmission line 13 between the power source 12 and load 14 is a power quality (PQ) monitoring system 16. The PQ monitoring system 16 includes a monitoring circuit 18 that samples windows of voltage and/or current of the power transmission at a specific location in the line 13. The PQ monitoring system 16 also includes a processor 20 for analyzing the window samples according to the process outlined herein to determine if a PQ event has occurred.

The monitoring circuit 18 includes hardware and firmware to monitor voltages and/or current on the transmission line at a specific location and provide that data to the processor 20 for analysis. In actual power systems found in the field, the hardware portion of the monitoring system is comprised by: Potential Transformers (PTs), which sense and step down the high amplitude voltages for further signal processing using a protective relay or processor 20; and Current Transformers (CTs), which sense and step down the high amplitude currents for further processing. If the transmission line is simulated using a commercial power systems simulator, then the hardware portion is replaced by voltage and current sensors included in the toolbox of sensors of the simulator.

The processor 20 includes non-transitory storage medium containing instructions for executing the process for analyzing the windows of voltage and/or current to determine if a PQ event has occurred. The monitoring system 16 may include other components as would be understood by one of ordinary skill in the art to report and/or transmit the results of the PQ analysis to an operator, such as but not limited to visual monitors, alarms, data output devices, wireless and hard wired transmission components.

In other embodiments, the monitored location may be at a power source or load or a transmission between power source and load. In an embodiment, the monitored location can be, but is not limited to, power transmission lines, generators, distributed energy resources (DERs) such as, but not limited to, battery storage lines, wind and solar generator power transmissions.

The following sections provide the analysis and application of the presented method in the context of several examples. The following sections are: Section II. DYNAMIC MODE DECOMPOSITION PRELIMINARIES presents the basic theoretical framework behind DMD. Section III. DMD TO ANALYZE POWER QUALITY EVENTS illustrates a method to analyze PQ disturbances based on DMD according to an embodiment of the disclosure. Section IV. SIMULATION AND RESULTS shows the results of the proposed PQ detection method with different simulation signals. Sections V. EFFECTS OF THE WINDOW SIZE IN THE PERFORMANCE OF THE DMD METHOD and VI. EFFECTS OF NOISE IN THE PERFORMANCE OF THE DMD METHOD shows the effect that the window size and the noise conditions of the input signal have on the proposed approach. Finally, Section VIII presents the SUMMARY.

II. Dynamic Mode Decomposition Preliminaries

The dynamic mode decomposition (DMD) is an equation-free method for discovering the dynamics of systems from available data. Originally proposed in fluid dynamics, DMD computes a reduced-order set of spatial modes which are associated with an oscillatory component at a determined frequency and growth/decay rate. DMD can be thought of as a method that integrates the dimensionality reduction of principal component analysis (PCA) with the Fourier transform to assign frequency components of time signals.

For a sequential set of vectors $x_1, x_2, \ldots, x_m$, where each $x_k \in \mathbb{R}^n$, it is assumed that the process that generates the data can be approximated by linear dynamics as $$x_{k+1} \approx A x_k \tag{1}$$

When the system that generates the data is linear, the modes and frequencies computed by DMD correspond to the normal modes of the system. For nonlinear systems, these modes and frequencies are a reduced-order approximation to the modes and eigenvalues of the Koopman operator. The DMD algorithm is presented below:

1) Arrange the data into matrices as $$X_{m-1} = \begin{bmatrix} | & | & & | \\ x_1 & x_2 & \cdots & x_{m-1} \\ | & | & & | \end{bmatrix} \tag{2}$$

$$X_m = \begin{bmatrix} | & | & & | \\ x_2 & x_3 & \cdots & x_m \\ | & | & & | \end{bmatrix} \tag{3}$$

Note that the idea is to find the best-fit linear operator in the form, $$X_m \approx A X_{m-1} \tag{4}$$

where $$A = X_m X_{m-1}^\dagger \tag{5}$$

and y is the Moore-Penrose pseudoinverse.

2) Compute the singular value decomposition (SVD) of $X_{m-1}$ $$X_{m-1} \approx U \Sigma V^H \tag{6}$$

where $U \in \mathbb{C}^{n \times r}$, $\Sigma \in \mathbb{C}^{r \times r}$, and $V \in \mathbb{C}^{m \times r}$. Note that r is the number of dominant (or meaningful) singular values selected and is a parameter that is practice selected by the user of the algorithm. Relationship (6) is then a reduced order version of $X_{m-1}$.

3) Compute $\tilde{A}$, a dimension reduced projection of the full matrix A in (5)

$$\tilde{A} = U^H A U = U^H X_m V \Sigma^{-1} \tag{7}$$

4) Compute the eigen decomposition of $\tilde{A}$ $$\tilde{A} W = W \Lambda \tag{8}$$

where $$W = \begin{bmatrix} | & | & & | \\ w_1 & w_2 & \cdots & w_r \\ | & | & | & | \end{bmatrix} \tag{9}$$

$$\Lambda = \begin{bmatrix} \lambda_1 & 0 & \cdots & 0 \\ 0 & \lambda_2 & \cdots & 0 \\ \vdots & \vdots & \ddots & \vdots \\ 0 & 0 & \cdots & \lambda_r \end{bmatrix} \tag{10}$$

5) Reconstruct the eigen vectors of A by $$\Phi = X_m V \Sigma^{-1} W \tag{11}$$

where $$\Phi = \begin{bmatrix} | & | & & | \\ \phi_1 & \phi_2 & \cdots & \phi_r \\ | & | & & | \end{bmatrix} \tag{12}$$

Note that those $\phi_k \forall k=1, \ldots, r$ are exact eigen vectors of A and are often called exact DMD modes. Note also that the eigenvalues of A are given by $\Lambda$.

It is highlighted that A is a matrix in discrete time. The relationship between discrete and continuous matrices is $$A_{discrete} = e^{A_{continuous} T_s}$$

where $T_s$ is the sampling time. The eigenvalues can be then transformed as $$\gamma_k = \frac{\ln(\lambda_k)}{T_s} \forall k = 1, \ldots, r \tag{13}$$

In continuous time, the solution of the system computed by DMD can be expressed as $$x(t) = \sum_{k=1}^{r} \phi_k e^{\gamma_k t} b_k = \Phi e^{\Gamma t} b \quad (14)$$

where $$b_k \ (\forall k=1,\ldots,r)$$

to the initial conditions of each mode.

III. MND to Analyze Power Quality Events

In steady-state and under ideal conditions, power system voltages and currents can be represented by $$y(t) = A_m \cos(\omega t + \phi_m) \quad (15)$$

where $A_m$, $\phi_m$, $\omega$ are, respectively, the amplitude, phase, and frequency (in radians per second) of the signal. Multiple signals can then be described as $$y_1(t) = A_1 \cos(\omega t + \phi_1) \quad (16)$$

$$y_2(t) = A_2 \cos(\omega t + \phi_2) \quad (17)$$

$$\ldots$$

$$y_n(t) = A_n \cos(\omega t + \phi_n) \quad (18)$$

These signals can be accommodated in a vector as $y(t) = [y_1(t), y_2(t), \ldots, y_n(t)]^T$ The measurement of $y(t)$ taken at time $t_k$ is noted as $$y_k = \begin{bmatrix} y_1(t_k) \\ y_2(t_k) \\ \vdots \\ y_n(t_k) \end{bmatrix} \quad (19)$$

By sampling these signals at a regular time interval $T_s$, as is typically done in power systems, a collection of vectors $y_k$ is available. These vectors can be organized as $$Y_{t-all} = \begin{bmatrix} | & | & & | \\ y_1 & y_2 & \cdots & y_m \\ | & | & & | \end{bmatrix} \quad (20)$$

where m is the number of available samples. Note also that each $$y_k \in \mathbb{R}^n$$

Note that the form in (20) is the same as (2) in or (3). Hence, the DMD approach in Section II can be used for power systems data. Even though the sinusoidal nature of typical power system signals is the result of the mechanical motion of synchronous generators, and that this motion is the result of inputs from prime movers: steam or water, these signals can also be the result of a marginally stable system with a pair of purely imaginary conjugate poles. A method such as DMD would tend to identify the marginally stable system for a dataset such as the one described in (20). Note also that a successful identification of such system would entail that the number of signals n>2. The user-defined parameter r in the second step of the DMD algorithm in Section II needs to be set to two.

Figure 2:
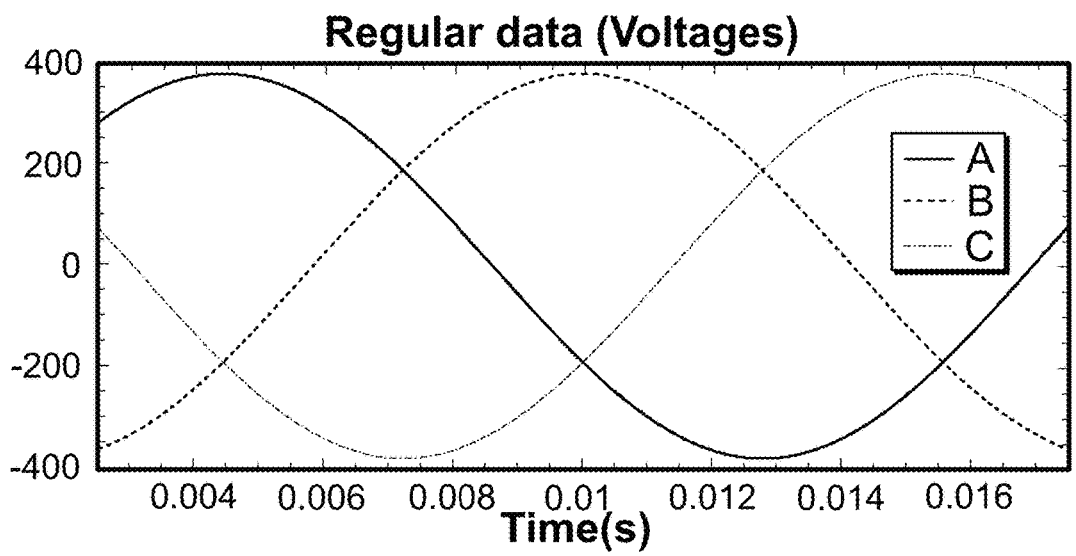
FIG. 2 shows ideal voltage waveforms according to an embodiment of the disclosure.
Figure 3:
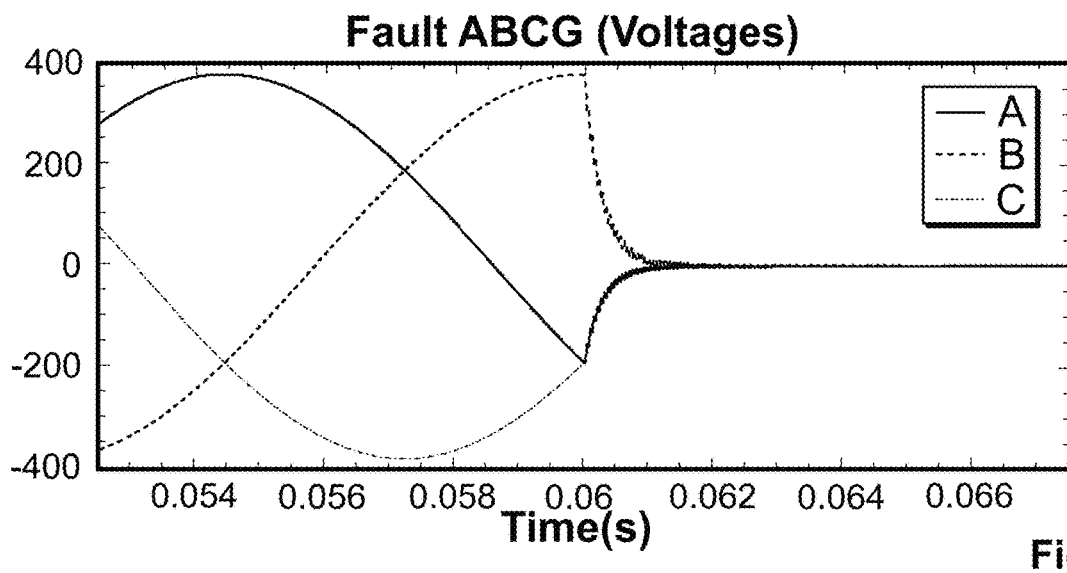
FIG. 3 shows voltage waveforms after a system fault.

The systems and methods use a window-based approach for event detection by looking at the eigenvalues determined by the DMD algorithm. To illustrate this idea, two windows of data are shown:

1) An ideal set of three-phase voltage signals shown in FIG. 2.
2) A set of three-phase voltage signals with a three-phase-to-ground (ABCG) fault as shown in FIG. 3.

The data in FIGS. 2 and 3 has a sampling rate of 2 MHz and only a window of 30,000 points is shown (this window corresponds to 15 ms). It should be noted that for the case in FIG. 3, the event occurs in the middle of the data set shown in the figure. Table 1 presents the eigenvalues identified with DMD for the data sets in FIGS. 2 and 3. This table also shows the eigenvalues detected for a smaller windows of data but centered around the same respective locations as those in FIGS. 2 and 3. The window sizes selected were of 3,000, 5,000, 10,000, 20,000 points in addition to the 30,000 points case. The results in this table show that, for the case of the ideal waveforms, for all window sizes, the real part of the identified eigenvalue is close to zero, while the imaginary component is close to 60 Hz (~377 in rad/s). The table also shows that for the case where the fault is included, for all window sizes, the real part of the eigenvalue exhibits large magnitude values, while the imaginary component deviates from the nominal frequency.

TABLE 1

| | Eigenvalues ($\gamma_{1,2} = \alpha \pm j\beta$) estimated by DMD | |
|---|---|---|
| Window Size | Ideal Data | Faulted Data |
| 3,000 | 0.046 ± j376.965 | −1188 ± j1319.40 |
| 5,000 | 0.047 ± j376.964 | −729.31 ± j928.30 |
| 10,000 | 0.052 ± j376.961 | −359.03 ± j567.06 |
| 20,000 | 0.054 ± j376.96 | −149.72 ± j392.11 |
| 30,000 | 0.011 ± j376.986 | −72.10 ± j364.92 |

The novel proposed systems and methods use a window of data to be analyzed by the DMD algorithm. The output of the window of data is a pair of eigenvalues. The window of data moves as new data becomes available; in such approach new values replace old ones so that the window size remains constant. The size of the window is a user selectable parameter ($n_W$) and its effect to the performance of the approach will be explored in Section V. In the ideal, though most computationally expensive case, a new data point $y_k$, creates a new window and hence a new pair of eigenvalues $\gamma_{1,2}$ as outputs. In practice, the proposed method can be implemented using online DMD which is a technique for real-time computation of DMD where the dynamics are updated when new information becomes available. Alternatively, to reduce the computational requirements, a stride approach could be used to form a windows spaced a certain amount of time and not every time a new data point is available. For those cases, an adaptive window size could be used, large windows are selected for normal operations but whenever there is an indication of a distortion in the input signals, the windows can be made smaller (even considering parts of the larger window).

Figure 4:
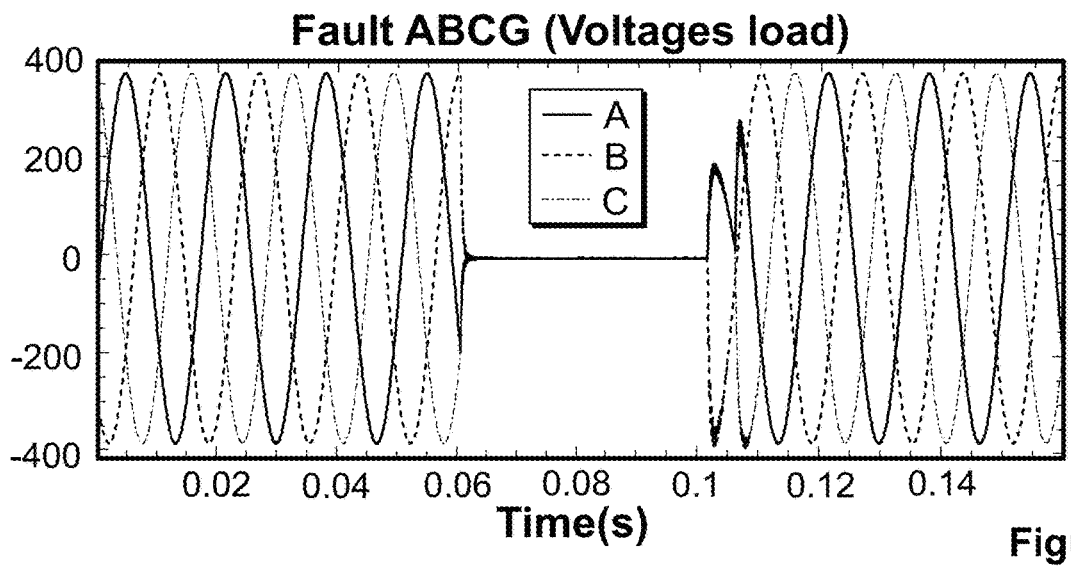
FIG. 4 shows a voltage waveform with a three-phrase to ground fault according to an embodiment of the disclosure.

The outlined approach was tested with the three-phase voltage signals in FIG. 4. These signals contain a three-phase to ground fault that occurs at 0.06 seconds and is cleared at 0.101 seconds. The signals are sampled at 2 MHz and the window of the approach is set to 3,000 points which corresponds to 1.5 ms. The real and imaginary parts of the eigenvalue as a function of time are presented in FIGS. 5A and 5B.

Figure 5A:
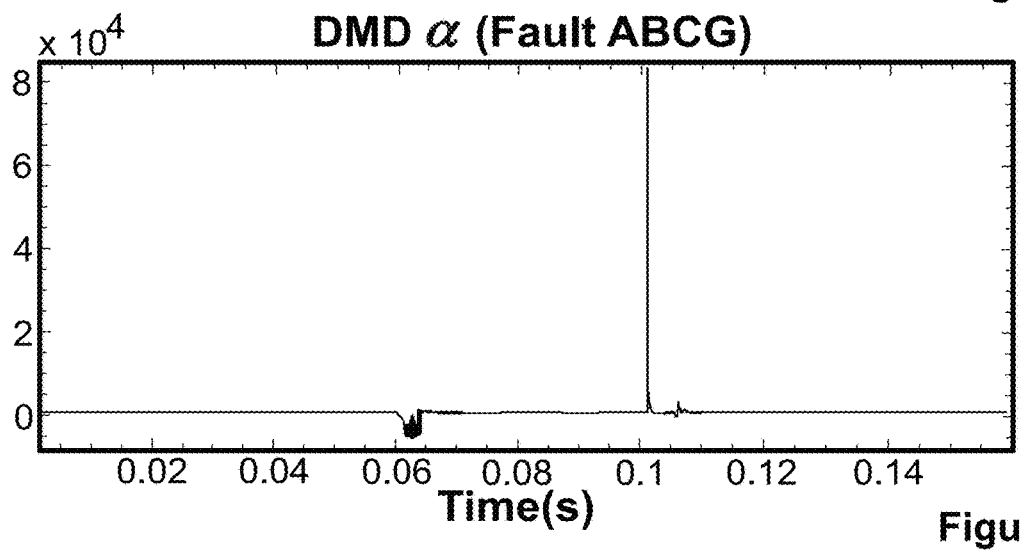
FIG. 5A shows a real part of DMD eigenvalue according to an embodiment of the disclosure.
Figure 5B:
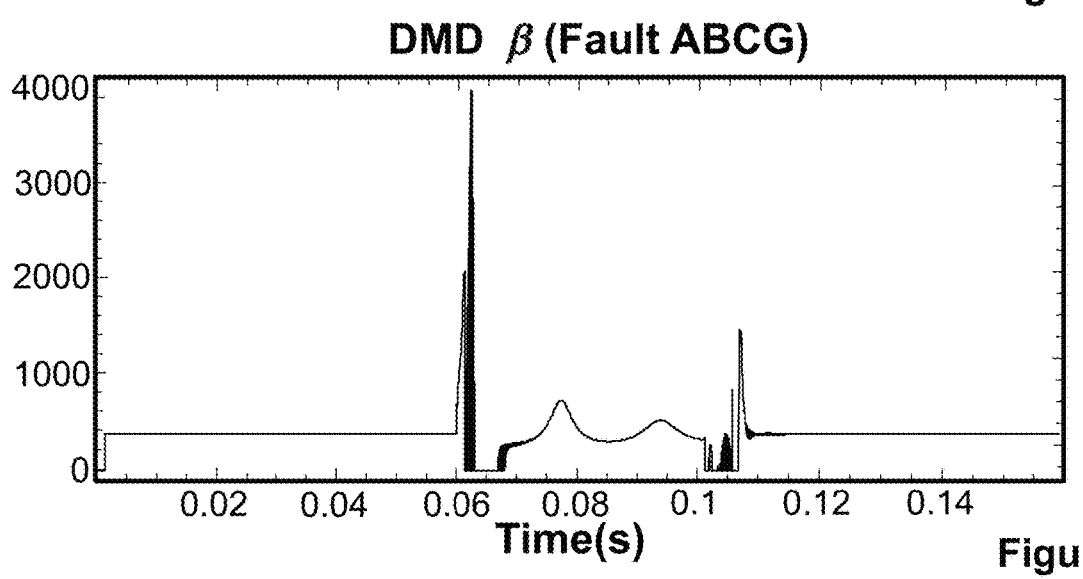
FIG. 5B shows an imaginary part of DMD eigenvalue according to an embodiment of the disclosure.

FIG. 5A shows that the real part of γ is zero for times where there is no fault while notably deviating from this value right after the fault occurs. While the fault is applied, this value presents deviations, and only after the fault is cleared, it returns to its value of zero. FIG. 5B shows that the imaginary part of γ is close to the nominal frequency for windows that do not contain fault information. However, when the fault is applied and cleared, strong deviations from this value are observed. In this work we will concentrate only on the real part of for fault detection. For brevity of notation, the real part of γ will be noted as a and the imaginary part as β.

The proposed method was also tested with power system signals affected with a phase-step. The reason for this test is to demonstrate that the proposed method is still valid for distortions that do not only affect the amplitude of the signal. Additionally, phase steps are a common problem in power systems, particularly at the distribution level.

Figure 6:
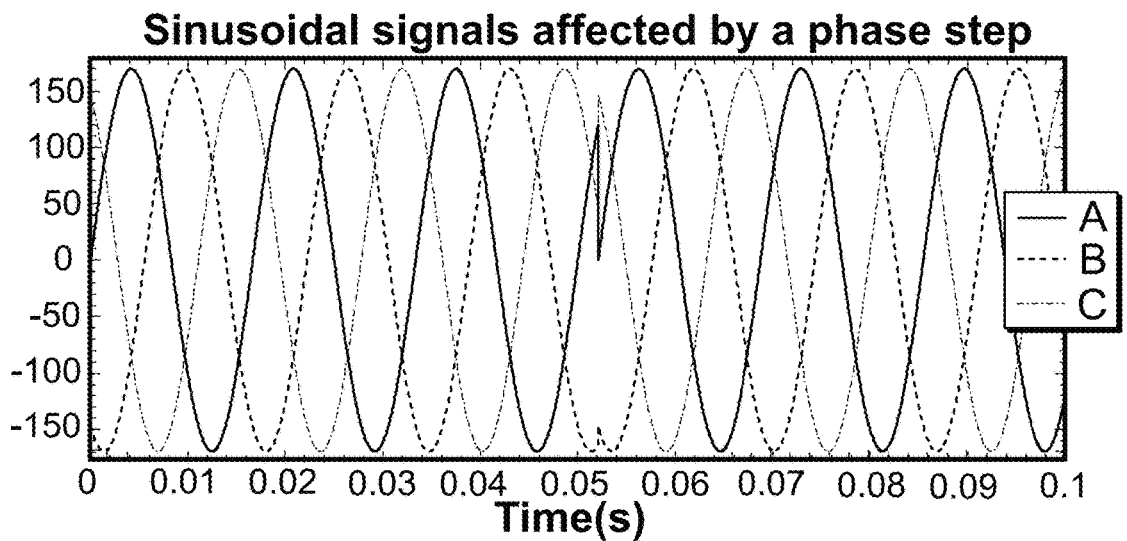
FIG. 6 shows a voltage waveform with a phase step according to an embodiment of the disclosure.
Figure 7A:
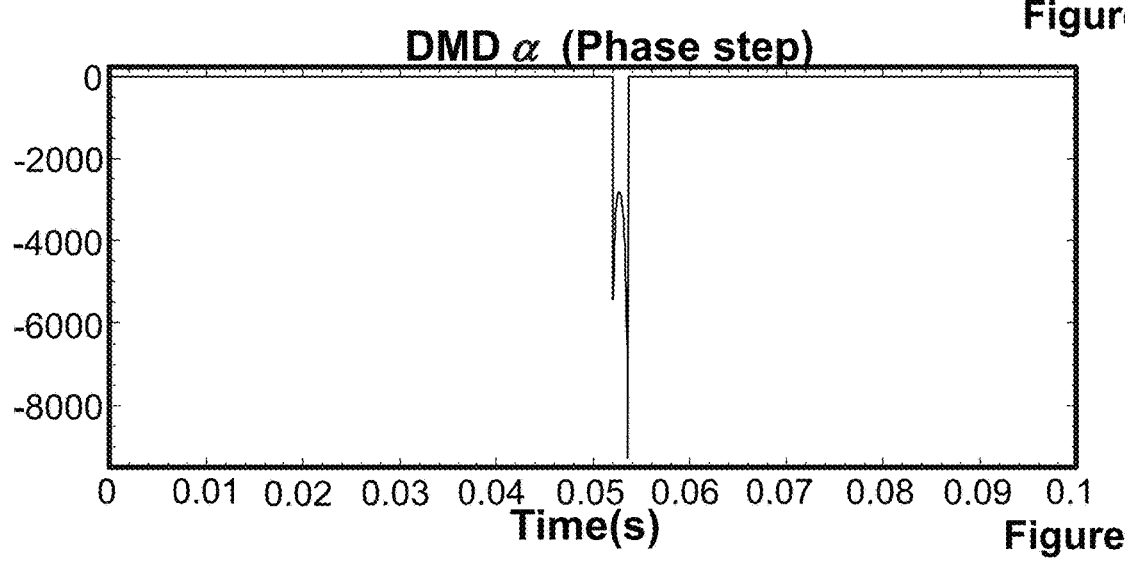
FIG. 7A shows a real part of DMD eigenvalue for a signal affected with a phase step according to an embodiment of the disclosure.
Figure 7B:
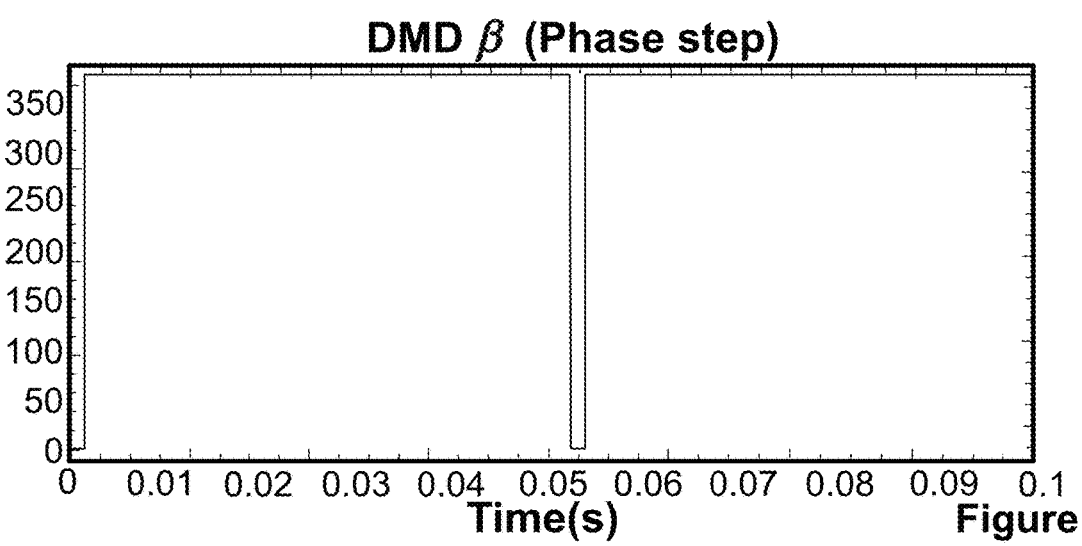
FIG. 7B shows an imaginary part of DMD eigenvalue for a signal affected with a phase step according to an embodiment of the disclosure.

FIG. 6 shows a synthetic signal that is affected by a phase step of −45° slightly after 0.05 s. The signal is also sampled at 2 MHz and the window of the proposed method is set to 3,000 points. The real and imaginary parts of the eigenvalue as a function of time are, respectively, presented in FIGS. 7A and 7B. Similar to the results in FIG. 5, the results show for the signal with a phase step shot that a is zero for the signal in normal operations (i.e., without any disturbance) but that very quickly takes negative values at times when the window captures the phase step. The results also shows that the imaginary part, P, is close to 377 rad/s in normal operations but becomes zero whenever the phase step is within the window of interest.

The method, as presented so far, requires the number of input signals to be greater than two. This is not an issue for three-phase systems, but it can be problematic for single phase systems, such as residential customer meters or reclosers on single-phase sections of the distribution system. For this reason, an extension to the method to one-dimensional input signals, where n=1, is presented below.

A one-dimensional signal sampled p times can be expressed as row vector of the form $$y = [y_{t1}, y_{t2}, \ldots, y_{tp}] \quad (21)$$

where $y_{ti}$ is the signal sampled at the $i^{th}$ time instant. From this vector, a matrix can be generated as $$Y_{t-all} = \begin{bmatrix} y_{t1} & y_{t2} & \cdots & y_{ts} \\ y_{t2} & y_{t3} & \cdots & y_{ts+1} \\ \vdots & \vdots & \ddots & \vdots \\ y_{tk-s} & y_{tk-s+1} & \cdots & y_{tp} \end{bmatrix} \quad (22)$$

Matrix (22) is formed by stacking one-element shifted versions of the row vector, y, one after the other. In this matrix, each skew-diagonal has a constant value. This process is based on the Hankelization idea that has already been proposed and studied in the context of DMD. The dimensions of (22) are $n_s \times p - n_s + 1$ where ns is the desired number of rows and a user-defined parameter. For one-dimensional, data (22) replaces (20) in the DMD method outlined above. Note that $n_s \geq 2$ and r must still equal two for this case.

Note the effect that ns has on the proposed method for analyzing power system signals. Table 2 presents the eigenvalues detected by DMD for the phase A signal in FIGS. 2 and 3 for different values of $n_s$ and when the number of points is 10,0001. The results in this table are similar to those in Table 2, and they show that for the case of ideal data, regardless of the value of ns, the eigenvalue detected by DMD has a real part close to zero and an imaginary component close to the nominal frequency. The results for the case of the faulted data show that for all values of $n_s$, the detected eigenvalue deviates significantly from the nominal values.

TABLE 2

Eigenvalues ($\gamma_{1,2} = \alpha \pm j\beta$) estimated
by DMD for a single phase
input with different $n_s$

| $n_s$ | Ideal Data | Faulted Data |
| --- | --- | --- |
| 2 | 0.067 ± j377.01 | −1414 ± j0 |
| 3 | 0.056 ± j376.973 | −4008 ± j1055.5 |
| 5 | 0.049 ± j376.959 | −3595 ± j1953.6 |

IV. Simulation and Results

This section presents results of using the DMD-based PQ event detection approach in Section III to a set of power system generated signals with different types of disturbances. The signals analyzed in this section were generated from simulations in Hypersim with a sampling frequency of 2 MHz. No noise was added to them and the size of the window for the DMD approach was set to 3000 (which corresponds to a window of 1.5 ms).

A. Simulation System

Figure 8:
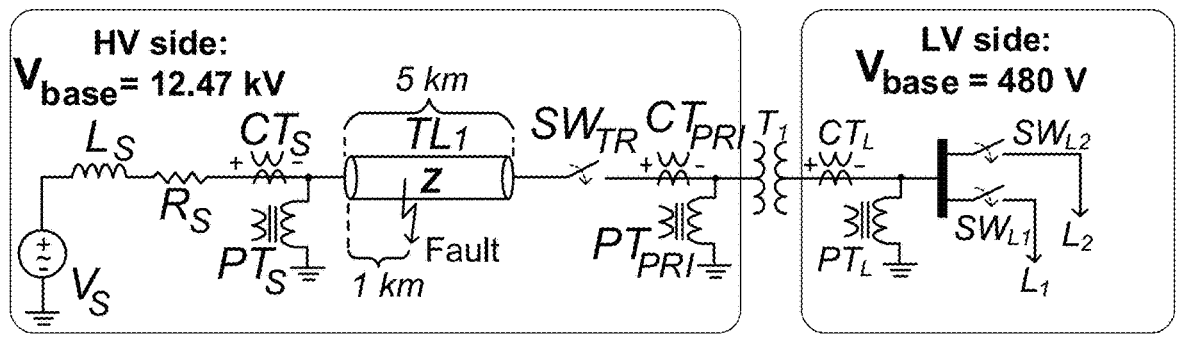
FIG. 8 shows an example of a 3-bus system experiencing a fault according to an embodiment of the disclosure.

The time signals analyzed in this section were generated using the simulated 3-bus power system shown in FIG. 8. Switches $SW_{TR}$, $SW_{L1}$, and $SW_{L2}$ were closed in chronological order to energize the transformer first, followed by loads L1 and L2, respectively. Also, different types of low-impedance faults were applied along the transmission line in the model to generate and analyze time-varying voltages and currents under abnormal operating scenarios.

B. Energizing Transformer and Load Connection

Figure 9A:
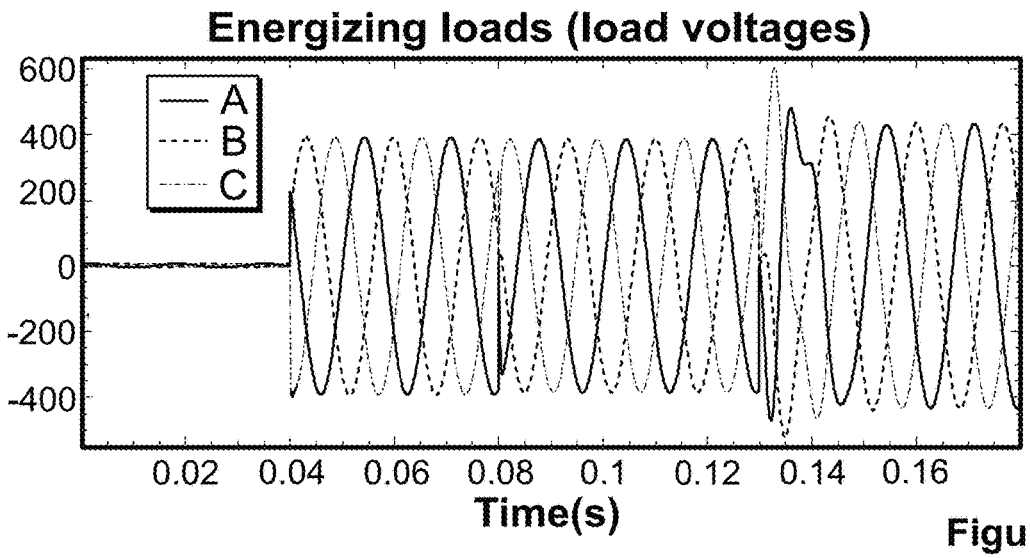
FIG. 9A shows voltage waveforms at the load side of a transformer according to an embodiment of the disclosure.
Figure 9B:
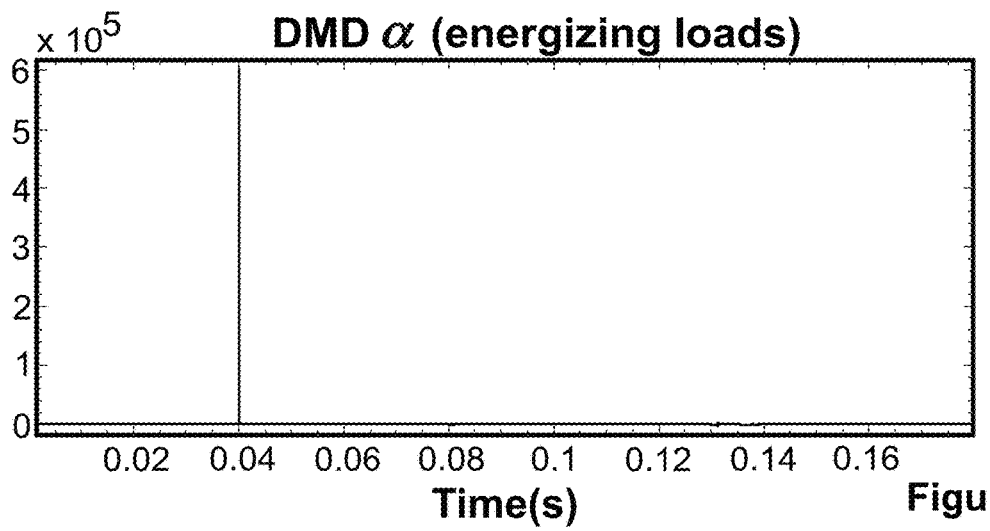
FIG. 9B shows DMD engineering loads (a) for the duration of the transformer energization and load connection event according to an embodiment of the disclosure.
Figure 10A:
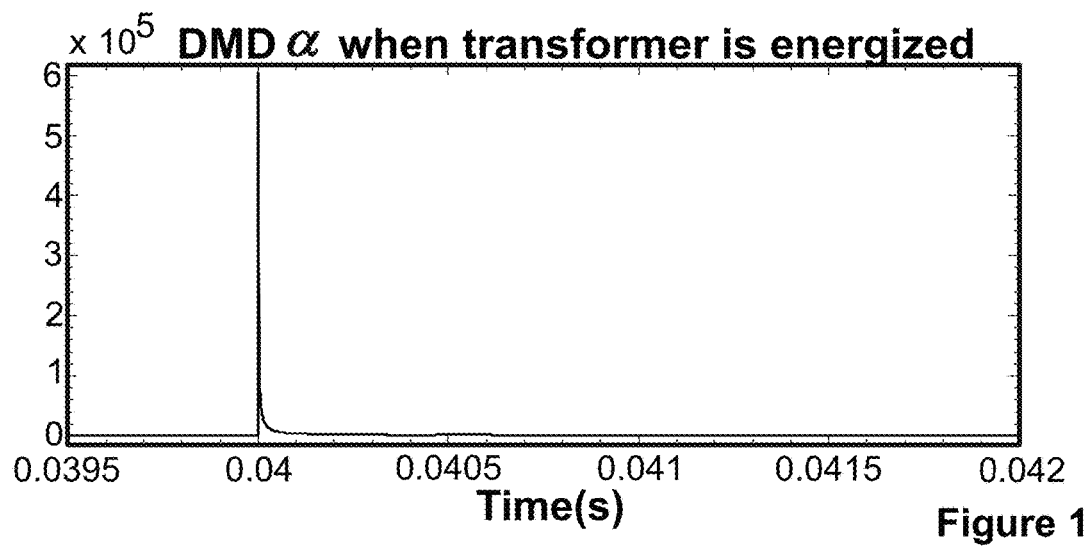
FIG. 10A shows DMD engineering loads (a) for the voltage signals in FIG. 8A when the transformer is energized according to an embodiment of the disclosure.
Figure 10B:
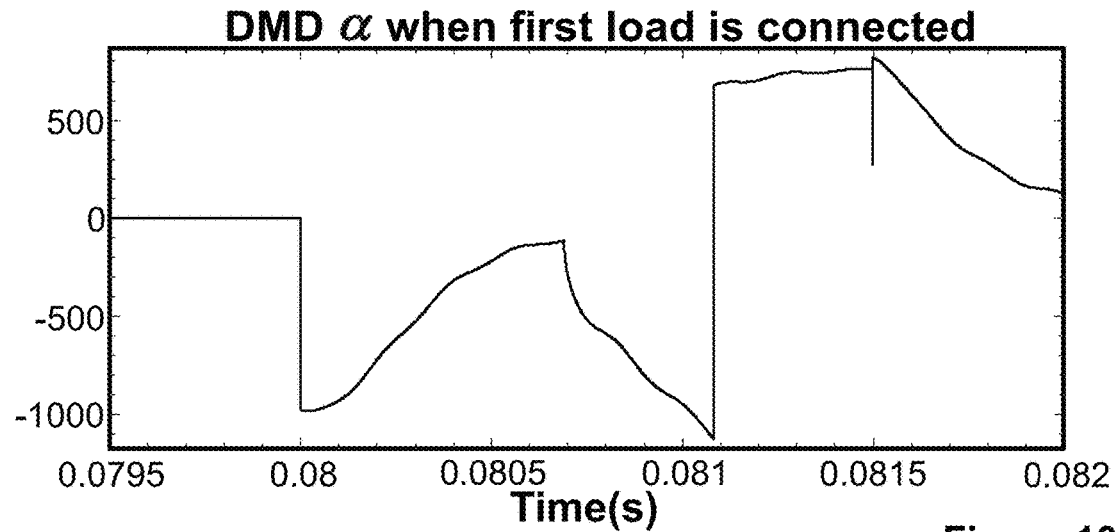
FIG. 10B shows DMD engineering loads (a) for the voltage signals in FIG. 8A when the first load is connected according to an embodiment of the disclosure.
Figure 10C:
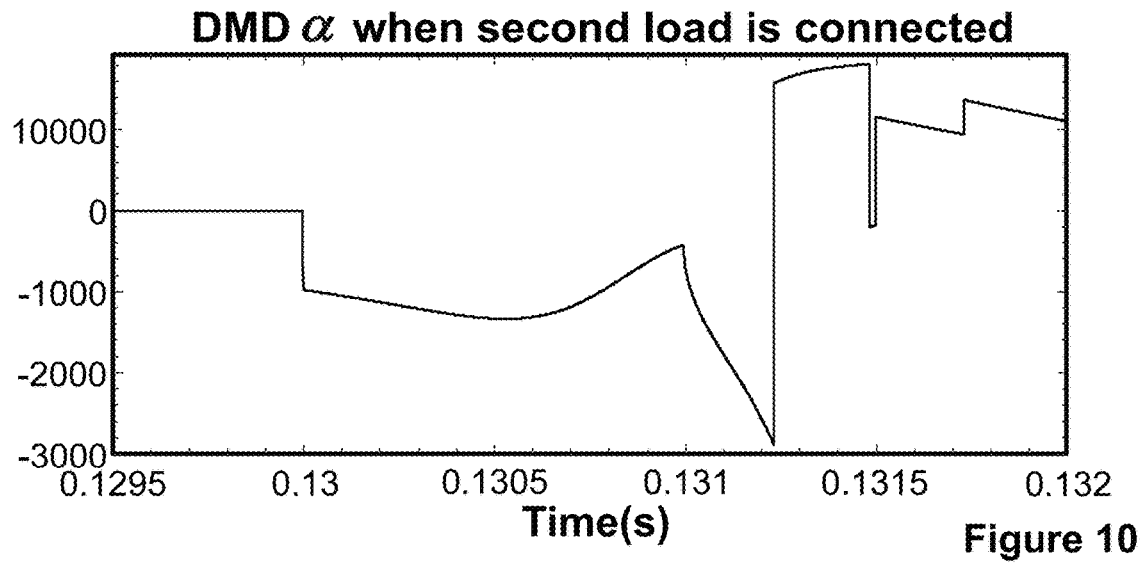
FIG. 10C shows DMD engineering loads (a) for the voltage signals in FIG. 8A when the second load is connected according to an embodiment of the disclosure.

FIG. 9A shows the three phase voltage signals at the bus with the load for a series of events: (i) the transformer is energized at 0.4 s, the first load is connected at 0.8 s and the second load is connected at 0.13 s. The results of estimating for these data are presented in FIGS. 10A, 10B, 10C. The results in these figures show that there is a huge spike in the value of right when the transformer is energized. FIG. 10A zooms in right at 0.4 s (when the transformer is energized) and shows that the spike has a value of about ~600 k and occurs 1 µs after the event. FIGS. 10B and 10C show the estimated value of a for both load connection events. These figures show quantitatively that both events are of the same kind as the shapes of the detected signal are similar. FIG. 10B shows as a function of time for the first load connection.

The results in this figure show that right at 0.08 ms, when the load is connected, experiences a jump from 0 to −978. These results also show that after 1.082 ms, a experiences a jump from −1126 to 676. The results for FIG. 10C are initially comparable to those in FIG. 10B with an initial jump from 0 to −978. However, the transition from positive to negative happens after 0.123 ms and is from −2888 to 1579.

Figure 11A:
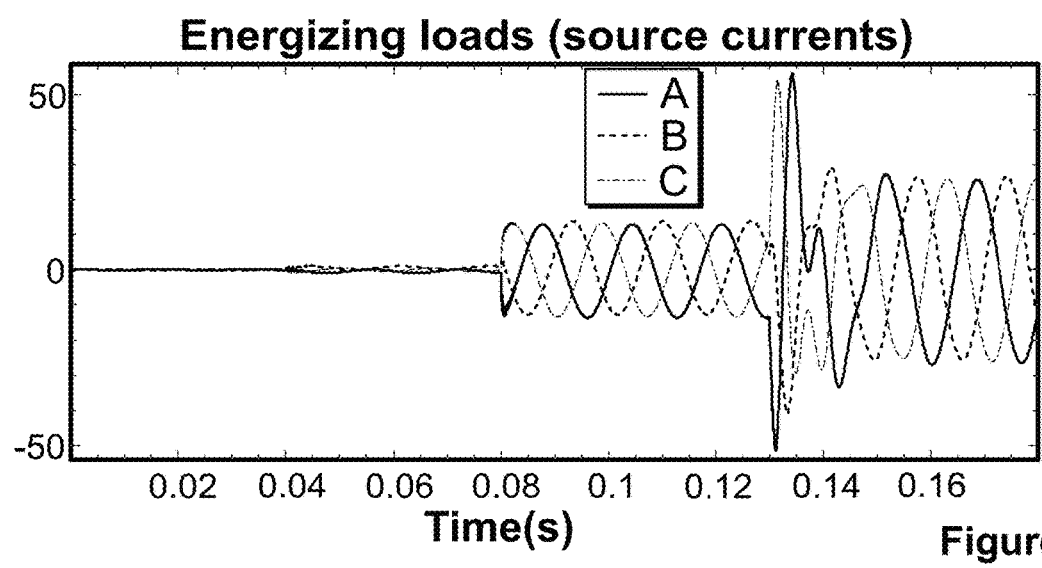
FIG. 11A shows current waveforms at the source that supply the system according to an embodiment of the disclosure.
Figure 11B:
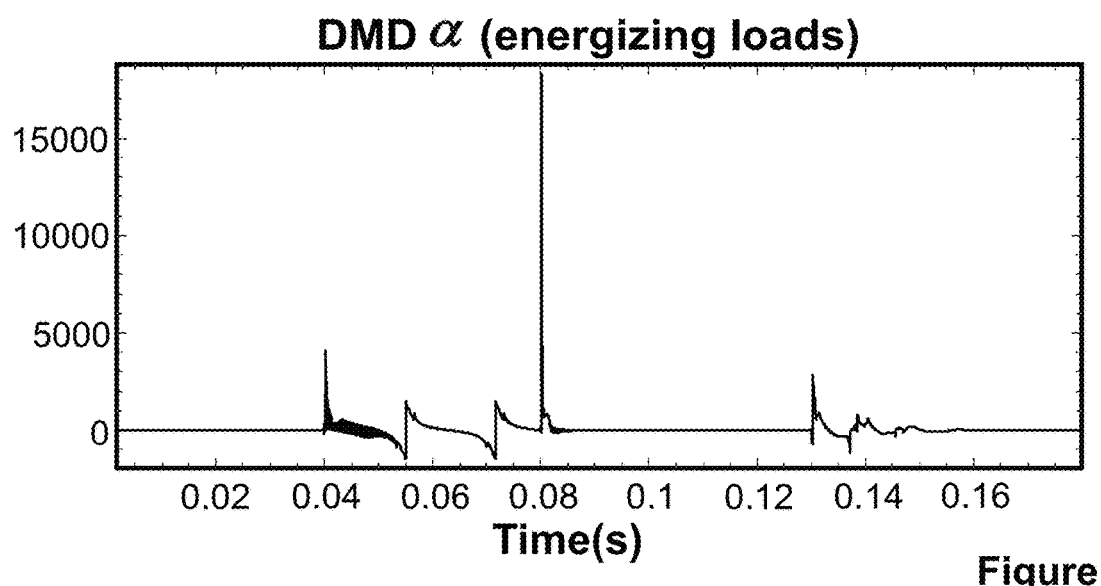
FIG. 11B shows DMD engineering loads (a) for the duration of the transformer energizing and load connection event.
Figure 12A:
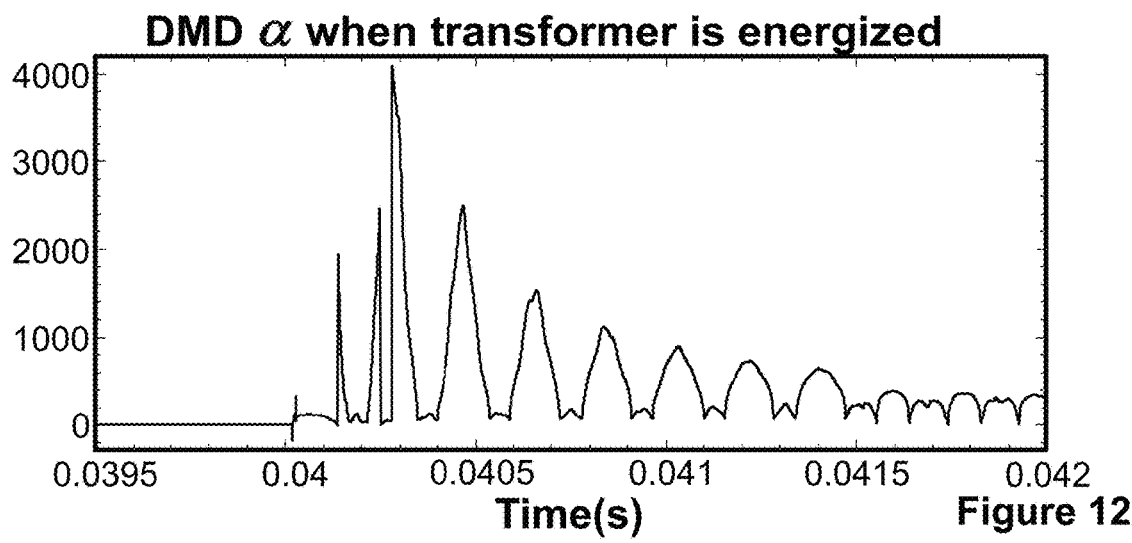
FIG. 12A shows real part of eigenvalue (a) for the current signals in FIG. 11A when the transformer is energized according to an embodiment of the disclosure.
Figure 12B:
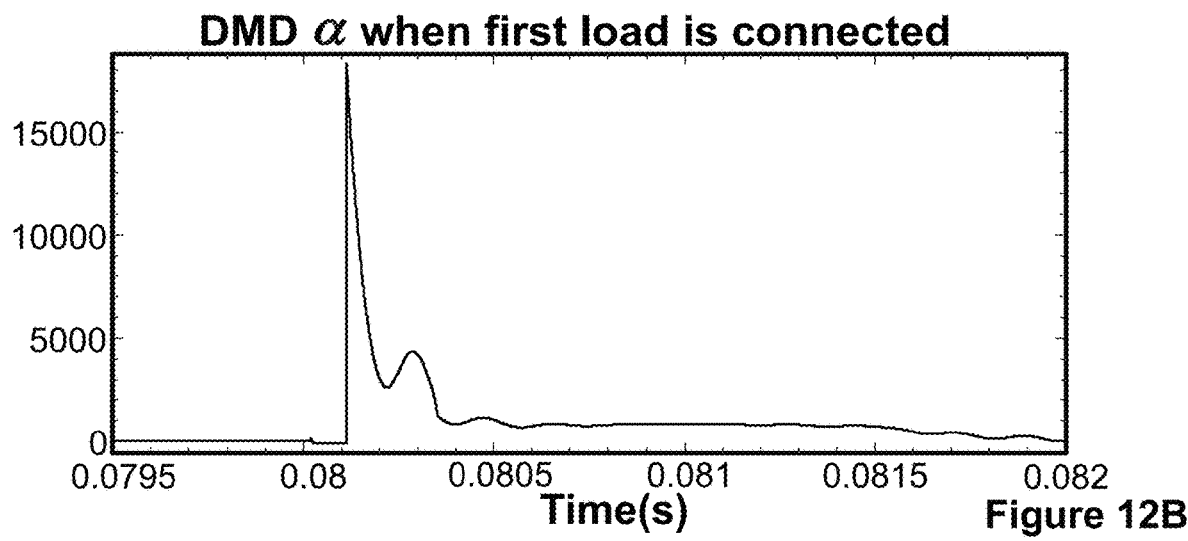
FIG. 12B shows real part of eigenvalue (a) for the current signals in FIG. 11A when the first load is connected according to an embodiment of the disclosure.
Figure 12C:
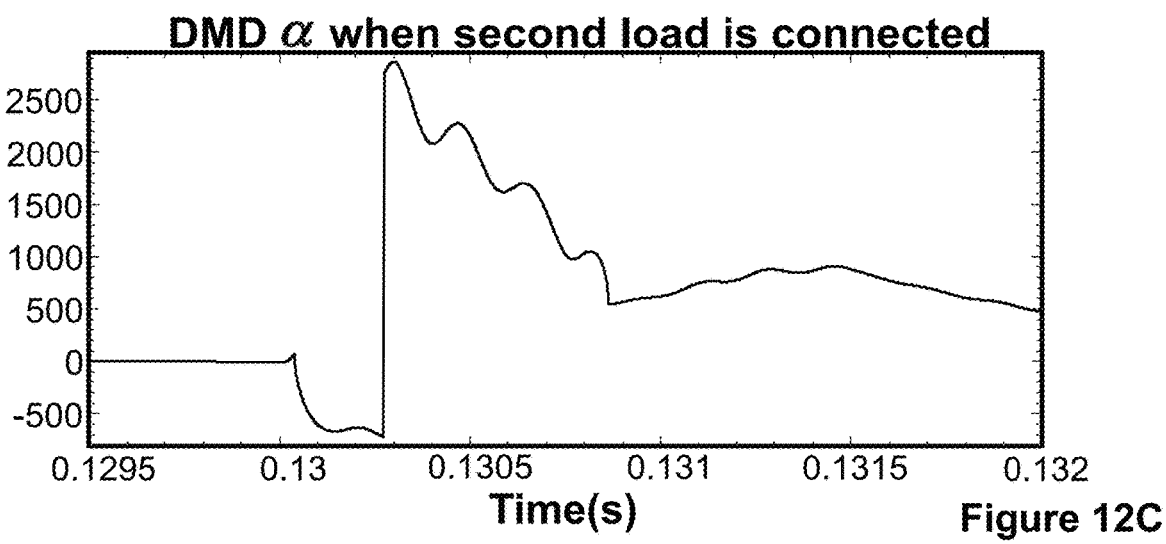
FIG. 12C shows real part of eigenvalue (a) for the current signals in FIG. 11A when a second load is connected according to an embodiment of the disclosure.

For the same series of events, the currents at the source that feeds the system were analyzed. These current signals are shown in FIG. 11A where it can be observed a net increase in magnitude when loads are connected. FIG. 11B shows that the value α for the signals in FIG. 11A spikes when the transformer is energized and when the loads are connected. FIGS. 12A, 12B, 12C, respectively, show zoomed in figures when: the transformer is energized, the first, and the second loads are connected. FIG. 12A shows that 18 µs after the transformer is energized, α briefly takes negative values up to −174 and then swings to a positive value of 326, 11 µs later. The maximum value occurs 280 µs after the event and reaches a value above 4000. FIG. 12B shows α right when the first load is connected (at 0.08 s). It can be observed that 114 µs after, the load is connected α spikes to reach a value greater than 18,000. Even though this spike does not last long, the value of α remains above 500 for at least 1.5 ms (until 0.0815 s). It is important to note that even though it is hard to observe from the figure, α initially takes a positive value of 133 after 21µ seconds after the load connection, but becomes slightly negative fast reaching a value of −114, 34µ after the event. The behavior of when the second load is connected, at 0.13 s, is shown in FIG. 12C. These results show that 40 µs after the second load is connected, α briefly reaches a peak of 70 before quickly becoming negative. 270 µs after this last event significantly increases from −723 to 2739 and continues with a small rise until it reaches a peak of 2865, 300 µs after the event. Afterwards it continues to decay slowly.

C. Line-to-Ground Fault

Figure 13A:
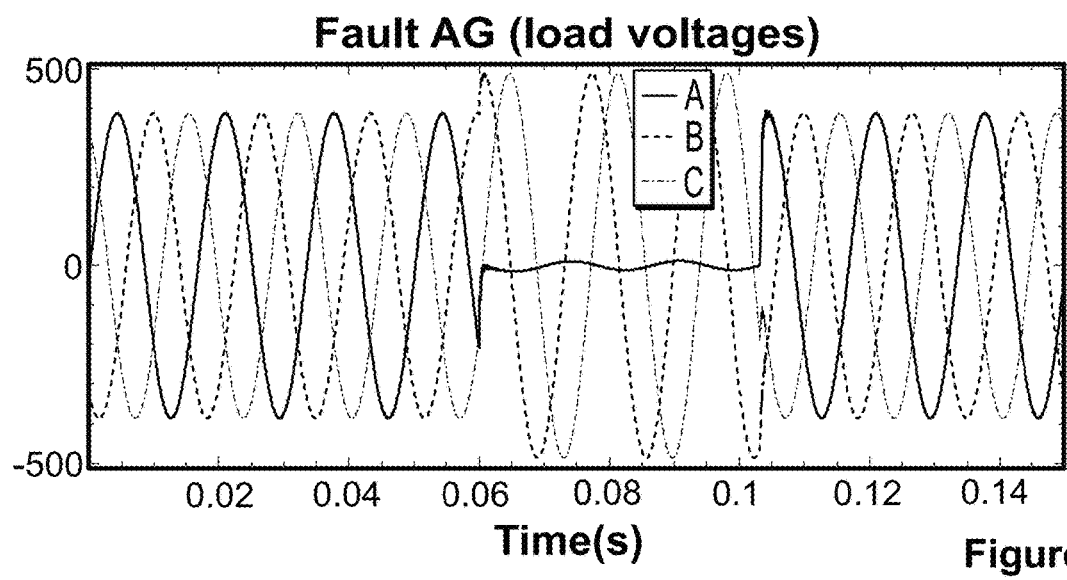
FIG. 13A shows voltage waveforms at the load for a line-to-ground fault according to an embodiment of the disclosure.
Figure 13B:
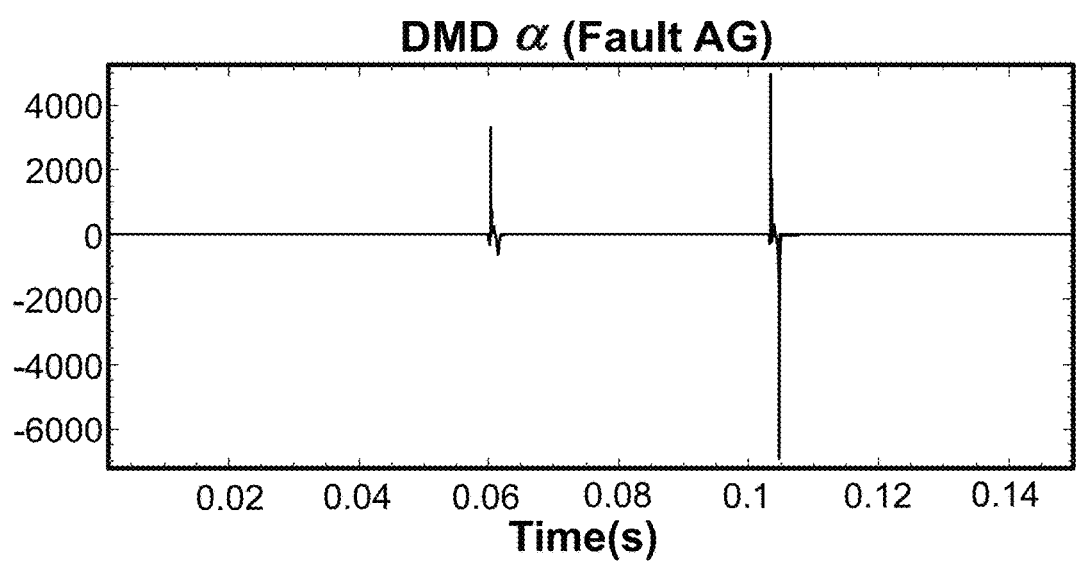
FIG. 13B shows real part of the DMD eigenvalue (a) of the voltage signals for the entire duration of the fault for a line-to-ground fault according to an embodiment of the disclosure.
Figure 14A:
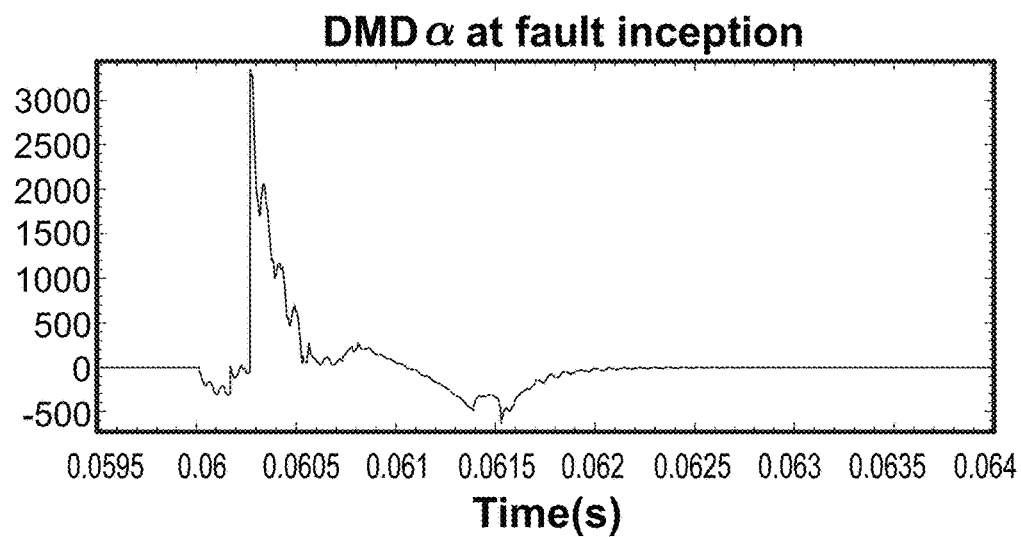
FIG. 14A shows a real part of eigenvalue (a) zoomed in around fault inception according to an embodiment of the disclosure.
Figure 14B:
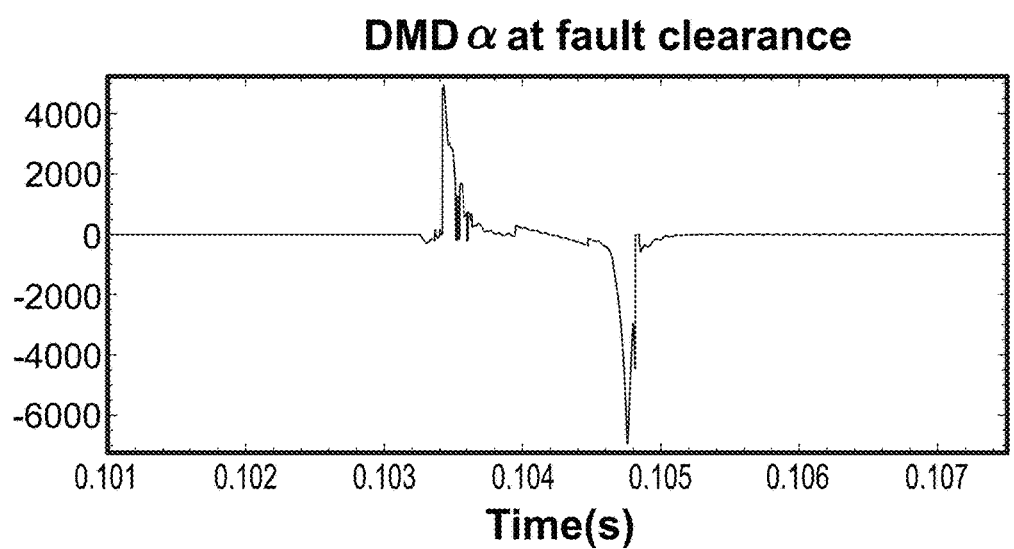
FIG. 14B shows a real part of eigenvalue (a) zoomed in around fault clearance according to an embodiment of the disclosure.

FIG. 13A shows three phase voltage signals at the load side of the system in FIG. 8 when it experiences a line-to-ground (AG) fault. The fault occurs at 0.6 s and is cleared at 0.103 s. FIG. 13B shows the detected value of a by the DMD PQ detection approach as a function of time. For this type of fault, α is also zero while the fault is applied but after the transient of the fault inception. FIG. 14A zooms in the value of a right when the fault occurs. The results in this figure show that very rapidly starts taking negative values, and 42 µs after the fault, it reaches a value of −201, then 269 µs after the fault its jumps from −37 to a value of more than 3,000. The deviation of α lasts for about 3 ms after the fault inception. FIG. 14B zooms in the value of α right when the fault is cleared. This figure shows that α becomes negative initially before experiencing a jump that reaches almost 5,000. A negative jump of almost −7,000 follows.

Figure 15A:
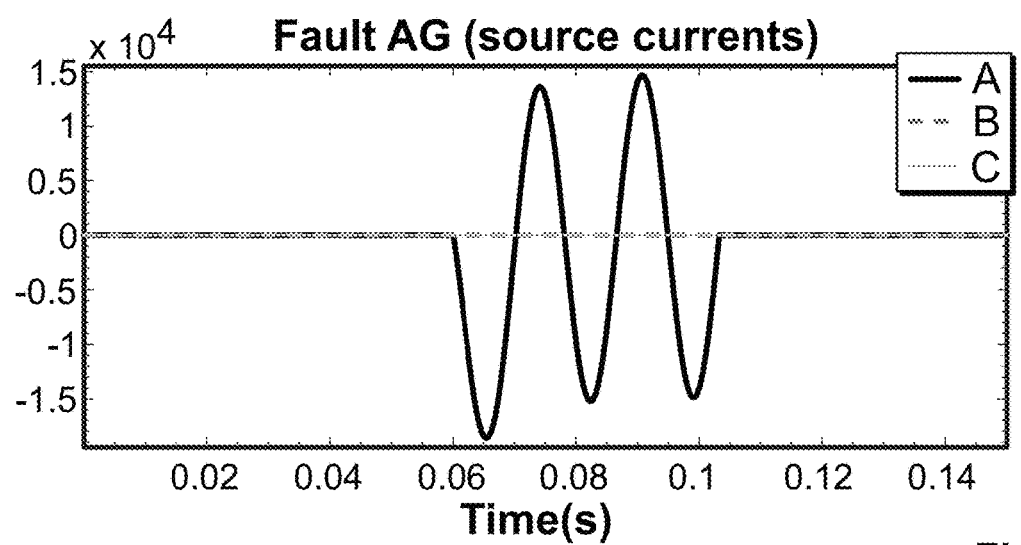
FIG. 15A shows current waveforms at the load for a line-to-ground fault according to an embodiment of the disclosure.
Figure 15B:
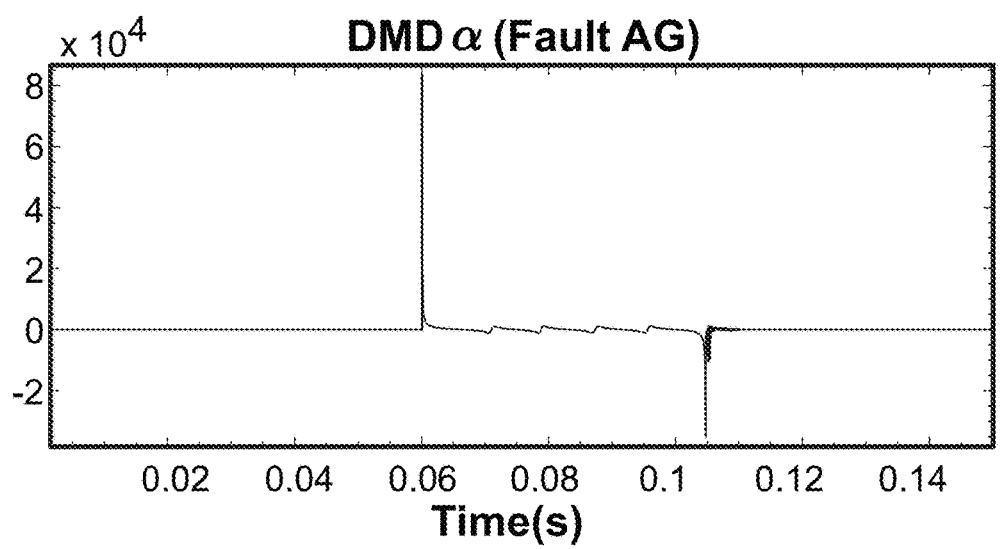
FIG. 15B shows real part of the DMD eigenvalue (a) of the current signals for the entire duration of the fault for a line-to-ground fault according to an embodiment of the disclosure.
Figure 16A:
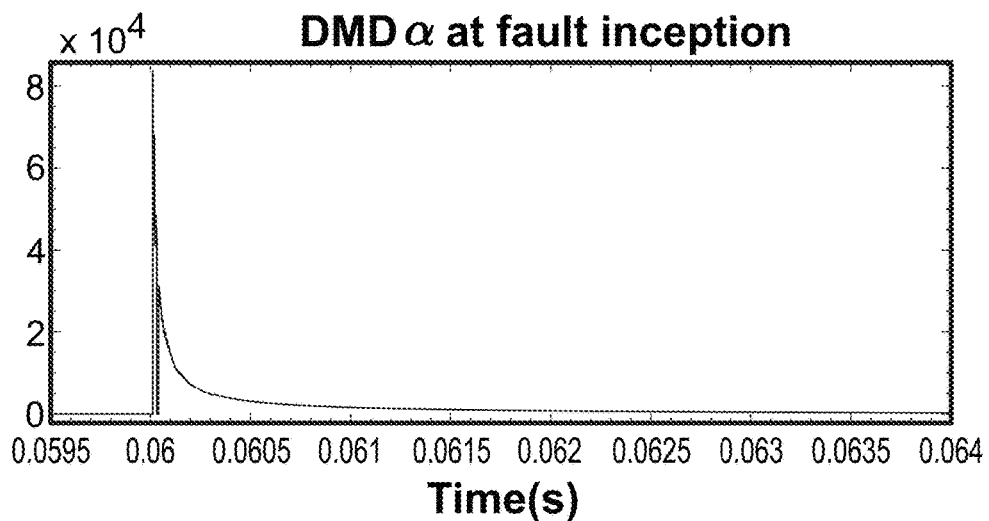
FIG. 16A shows real part of the eigenvalue (a) zoomed in around fault inception according to an embodiment of the disclosure.
Figure 16B:
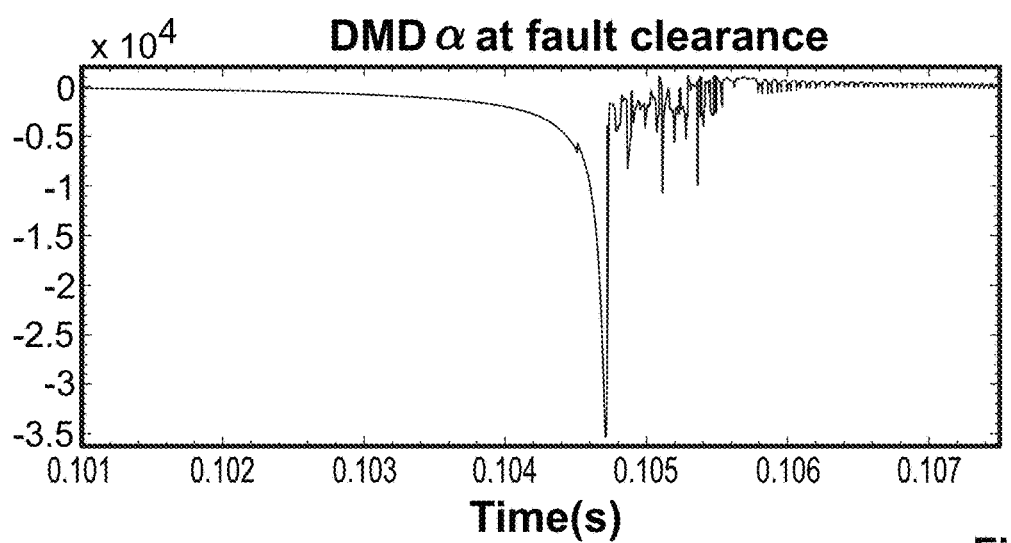
FIG. 16B shows real part of the eigenvalue (a) zoomed in around fault clearance according to an embodiment of the disclosure.

FIG. 15A shows three-phase current signals from the source that feeds a system that experiences a line-to-ground fault. The fault occurs at 0.6 s and is cleared at 0.103 s. The detected value of α by the DMD PQ detection approach as a function of time is shown in FIG. 15B. This figure shows that α experiences a huge positive spike when the fault is applied and a large negative one when it is cleared. The value of α oscillates from positive to negative while the fault is applied. A closer look at α around the fault inception and clearance is provided in FIGS. 16A and 16B. FIG. 16A shows that 13 µs after the fault is applied a reaches a value above 85,000. A relatively fast decay follows. FIG. 16B shows that after the fault is cleared, a rapidly takes a value of −35,000. After this peak has been reached, a almost immediately drops to a value of −40,000. A somewhat erratic but decaying oscillation follows.

V. Effects of the Window Size in the Performance of the DMD Method

This section studies how the PQ event detection approach in Section III is affected by the size of the window that determines the amount of data processed at a single instant. To this end, the different window sizes were considered for input signals with a sampling rate of 2 MHz:

A window size of 500 points, which corresponds to a time of 250 µs;

A window size of 1,000 points, which corresponds to a time of 500 µs;

A window size of 3,000 points, which corresponds to a time of 1.5 ms;

A window size of 10,000 points, which corresponds to a time of 5 ms;

A window size of 30,000 points, which corresponds to a time of 15 ms.

Figure 17:
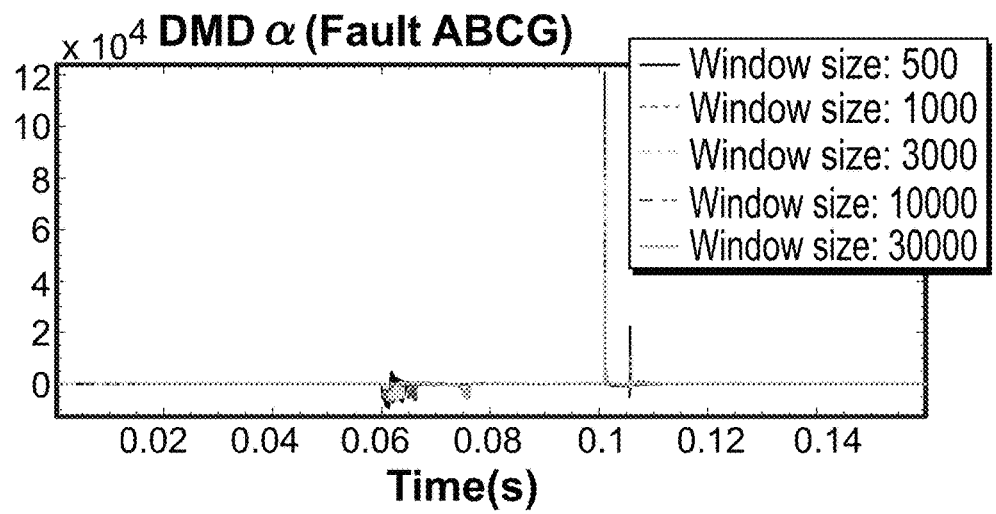
FIG. 17 shows real part of the eigenvalue (a) as a function of time for a three-phase fault for different window-size cases according to an embodiment of the disclosure.
Figure 18:
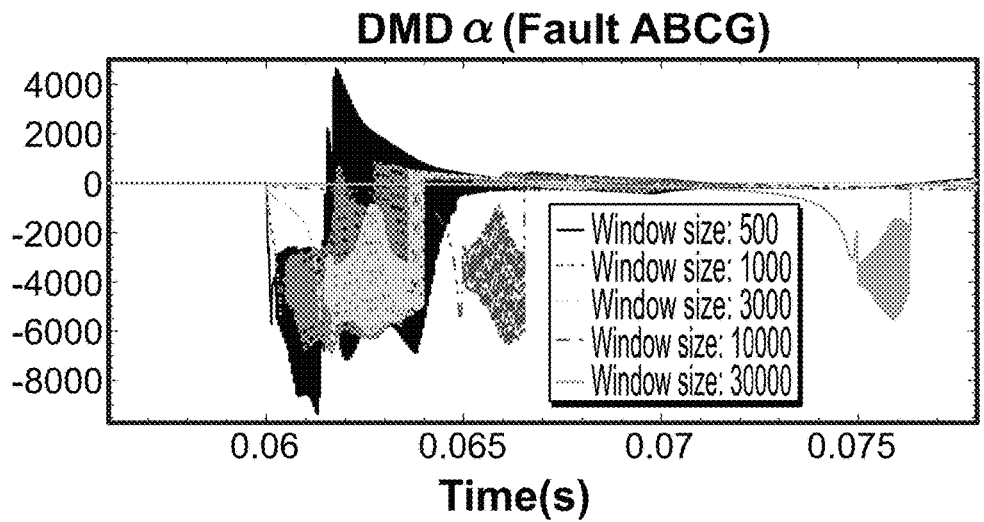
FIG. 18 shows real part of eigenvalue (a) as a function of time for a three-phase fault for different window-size cases, zoomed in around the fault inception.
Figure 19:
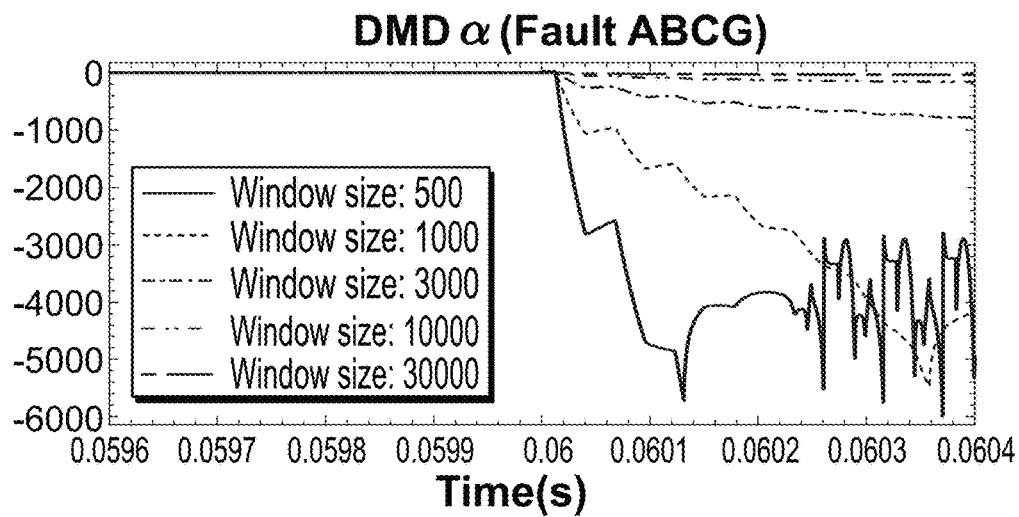
FIG. 19 shows real part of eigenvalue (a) as a function of time for a three-phase fault for different window-size cases, closer zoom around the fault inception according to an embodiment of the disclosure.

FIGS. 17-19 show α as a function of time for the voltage signals in FIG. 4 for a three-phase-to-ground fault for the different window size cases outlined above. The results in FIG. 17 show that when the fault is applied and cleared, strongly deviates from the no-fault value of ~0. FIG. 18 zooms in around the fault inception and shows the extent of the variation of a for all the window cases. FIG. 19 shows the results of a right when the fault occurs. The results in FIGS. 18 and 19 show that, as expected, the window size determines how fast a reaches its maximum deviation. For the case of the largest window, of 30,000 points, a reaches values of −4000 (and higher magnitudes) after 15 ms which is the window size. The duration of this large deviation is approximately 1.3 ms (from 0.075 s to 0.0763 ms). It should be noted that even though this large variation is only noticed after 15 ms and lasts only 1.3 ms, begins deviating slowly from ~0 right after the fault occurs, with the initial deviation being of around −43 (which cannot be observed in the figures). The results in FIGS. 17-19 show that as expected, the larger the window size, the longer the time it takes to reach its maximum value, and the smallest the variation is. The results in FIG. 19 show that for the case of the smallest window, of 500 points, a very rapidly deviates from the steady-state value of ~0 and reaches almost −6000 after only 100 µs. It is important to note that just as the steady-state value of α is ~0, the steady-state value of β is ~377 for the case of 500 window-size (and for all the cases studied). This is important because the DMD method is able to determine the oscillatory dynamics of the data even without having access to a full period of the signal, in fact for the smallest window case, the window only contains 1:5% of a full period (250 µs out of 16.667 ms). This result is related to the fact that the sampling frequency of the input signal is high (2 MHz). The appropriate window size is dependent on the final application of the method. However, the sampling rate and the noise levels of the input signals are important in defining the size. Smaller window sizes tend to be more sensitive to determining the occurrence of a fault but tend to be more affected by noise. For higher noise rejection, the larger the window the better.

VI. Effects of Noise in the Performance of the DMD Method

Figure 20:
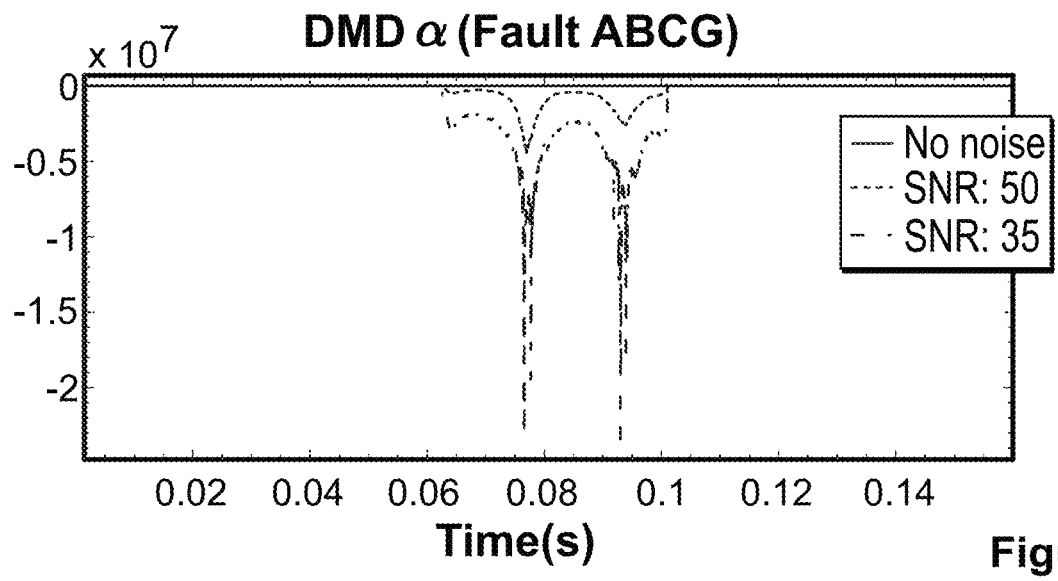
FIG. 20 shows real part of eigenvalue (a) as a function of time for a three-phase fault for different SNR levels of the input signal according to an embodiment of the disclosure.
Figure 21:
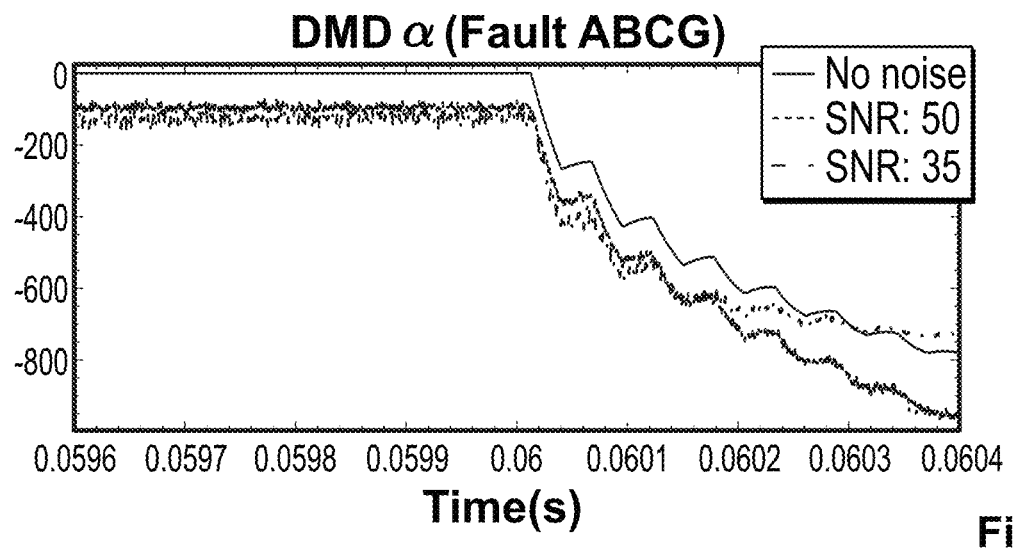
FIG. 21 shows real part of eigenvalue (a) as a function of time for a three-phase fault for different SNR levels of the input signal, zoom in around fault inception according to an embodiment of the disclosure.

This section presents the effect that including noise to the input signal has on the performance of the proposed PQ event detection approach. When noise is added to the signal, the model in (15) becomes $$y(t)=A_m \cos(\omega t+\phi_m)+n(t) \quad (23)$$

where n(t) is an additive white Gaussian noise. To study how the PQ event detection method in Section III is affected by noisy signals, three different cases were studied: (i) a base case where the input signals have no noise, (ii) a case where the input signal has a signal-to-noise ratio2 (SNR) of 50 dB, and (iii) a case where the SNR level is decreased (and hence the power of the noise increased) to 35 dB. These cases were studied for different signals with similar results, but in this disclosure, due to space limitations, only the results for a three-phase-to-ground fault were included. FIGS. 20-21 show α as a function of time for the voltage signals in FIG. 4. FIG. 20 shows that for the 50 and 35 dBs of SNR cases, α takes huge negative values while the fault is applied. Compared with the cases with noise, the values of the case without any noise seem to be zero. However, as shown in FIG. 5A, this is not the case. FIG. 21 shows α right at the instant when the fault occurs, where it can be seen that for the no noise case and the two noise cases, α takes negative values very quickly. It is interesting to note, however, that for the two noise cases before the fault occurs, the value α takes is no longer close to zero, rather it takes values close to −90 and −140 for the 50 and 35 dB cases, respectively. In fact, the value α takes for noncorrupted signals has variations of around 50 with respect to their means. Because the variations of α for the not faulted data are insignificant with respect to the variations when the data has a fault in it, the proposed PQ event detection method can still be used for noisy data.

VII. Comparison of the DMD Method with DWT and MM

This section compares the proposed DMD method in Section III for PQ event detection with WT and MM. The set of signals used in this section are those of a three-phase fault in the system of FIG. 8.

A. DMD Result Extension

Figure 22:
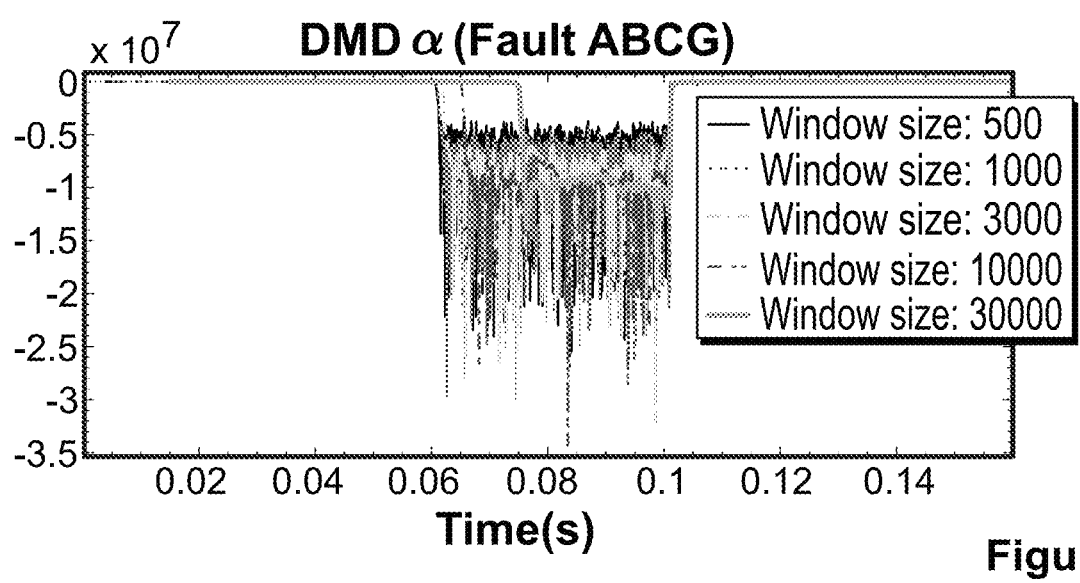
FIG. 22 shows real part of eigenvalue (a) as a function of time for a three-phase fault for different window sizes when the input signal is affected by a 20 dB SNR according to an embodiment of the disclosure.

The results of applying the proposed DMD method to the signals in FIG. 4 is presented in FIGS. 17-19 in Section V for different window sizes. As already mentioned above, these results show that the proposed DMD method can be a valuable tool, as the WT and MM, for detecting PQ distortions in power systems signals. Here, these results are expanded to take into account a SNR level of 21 dB. FIG. 22 shows the a as a function of time for the signals in FIG. 4 but when additive white gaussian noise was added to achieve a 20 dB SNR. The results show that for all window sizes under consideration, the proposed method exhibits a different behavior in the cases where the signal is in steady operations compared to cases where there is a distortion present.

B. The Wavelet Transform

Figure 23A:
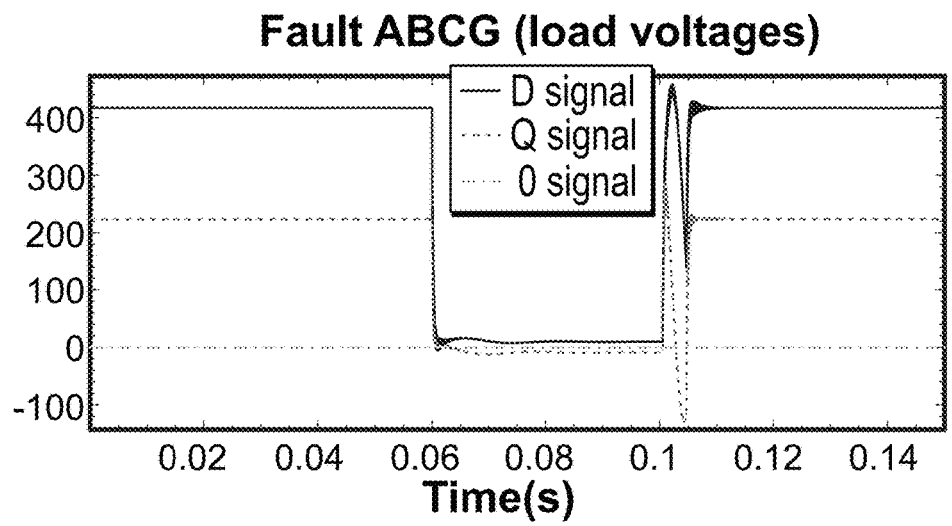
FIG. 23A shows a DQ0 transform of the voltage signals for a three-phase fault in FIG. 4 according to an embodiment of the disclosure.

The WT is a signal processing tool for analyzing simultaneously the time and frequency information of a given signal. The WT allows different frequency contents to be determined for different time intervals. This property of being able to determine time-varying frequency content with certain degree of accuracy makes the WT one of the most valuable tools for analyzing power system signals with distortions following a system event. For such cases, the idea is to use the WT to pinpoint the higher frequency components that are produced when the power system's typical operations are affected by a disturbance (e.g., a system fault). The WT is found via the inner product of the input signal with a basis function called the mother wavelet. In practice, it is computed using a method known as multiresolution analysis (MRA). In MRA, the input signal is passed through a set of high- and low-pass filters and decimators. The output of each high-pass filter yields a set of coefficients in what is known as a level of decomposition of the signal. Each of these levels of decomposition has a frequency band associated with it. In the traditional MRA implementation, each level of decomposition is decimated by a factor of two and hence the number of reconstructed coefficients halves with at each level of decomposition increase. However, in power systems applications, it is more common to use the reconstructed coefficients as they produce time signals with the same resolution as the input signal. This methodology uses the DWT reconstructed coefficients for PQ event detection. This methodology also applies the DQ0 transform to the signals in FIG. 4 before applying the DWT. The results of the DQ0 transform are shown in FIG. 23A. The DQ0 transform was applied because it put the AC signals in a rotating reference frame that produces DC signals for analysis. This work uses Daubechies8 as the mother wavelet for the results presented and focuses on the first six levels of decomposition.

Table 3 shows the frequency ranges associated with each level of decomposition under consideration. The higher level considered in this work is 6, and the total frequency range under analysis is from 1 MHz to 15.625 kHz. These levels were selected because traveling-wave phenomena occurs within the higher part of this frequency range.

TABLE 3

| Level of Decomposition | Freq. Range |
| --- | --- |
| \multicolumn{2}{c}{Frequency range for each level of decomposition when the input signal is sampled at 2 MHz} | |
| 1 | 1 MHz-500 kHz |
| 2 | 500 kHz-250 kHz |
| 3 | 250 kHz-125 kHz |
| 4 | 125 kHz-62.5 kHz |
| 5 | 62.5 kHz-31.25 kHz |
| 6 | 31.25 kHz-15.625 kHz |

Figure 23B:
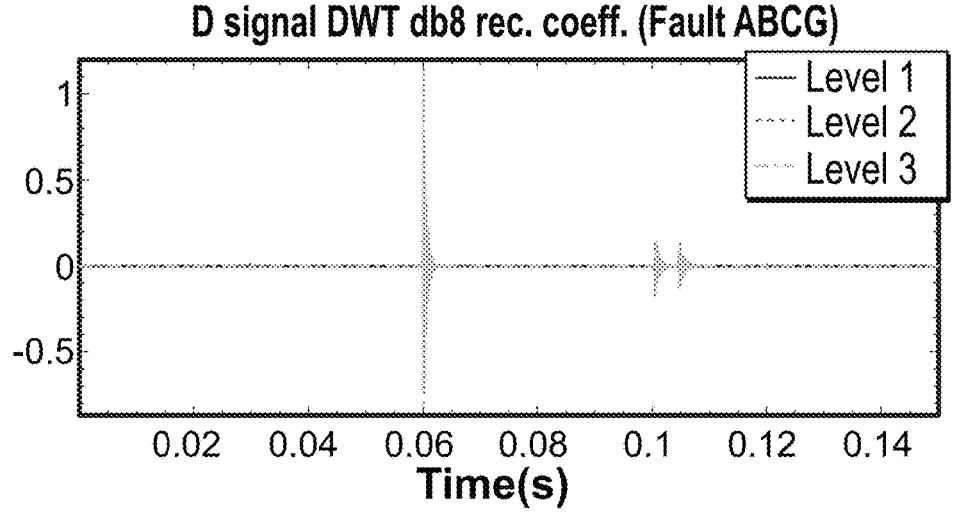
FIG. 23B shows MRA reconstructed coefficients for levels 1-3 according to an embodiment of the disclosure.
Figure 23C:
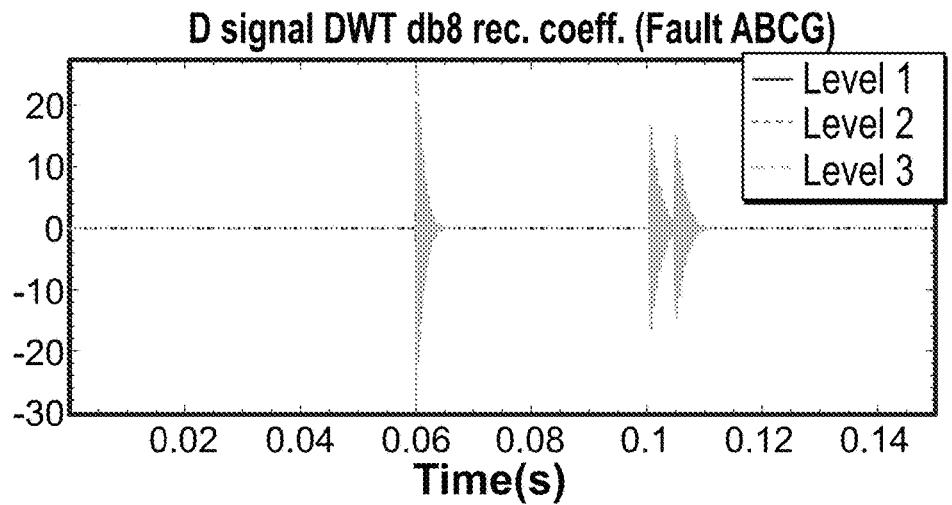
FIG. 23C shows MRA reconstructed coefficients for levels 4-6 according to an embodiment of the disclosure.

FIG. 23B shows the reconstructed coefficients for the first three levels of decomposition of MRA while FIG. 23C shows the reconstructed coefficients for the MRA levels of decomposition 4 to 6. The results in these figures show that there is energy at all the frequency ranges associated with the levels of decomposition when the fault is introduced and when is cleared (note that even though not clear in the figure, all levels of decomposition have changes when the fault is introduced and cleared). These results align with those of literature that show the WT as a valuable tool for PQ detection.

Figure 24A:
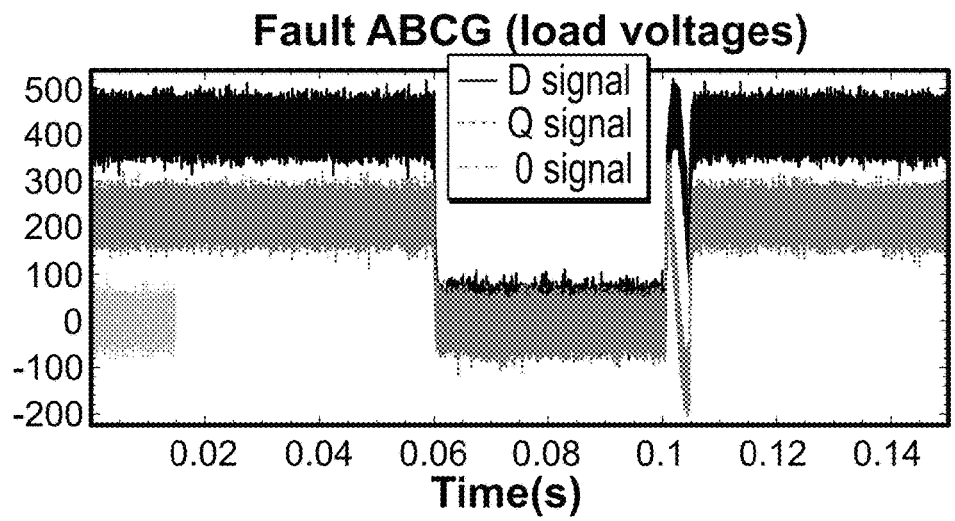
FIG. 24A shows a DQ0 transform of the voltage signals for a three-phase fault in FIG. 4 with a SNR of 20 dB according to an embodiment of the disclosure.
Figure 24B:
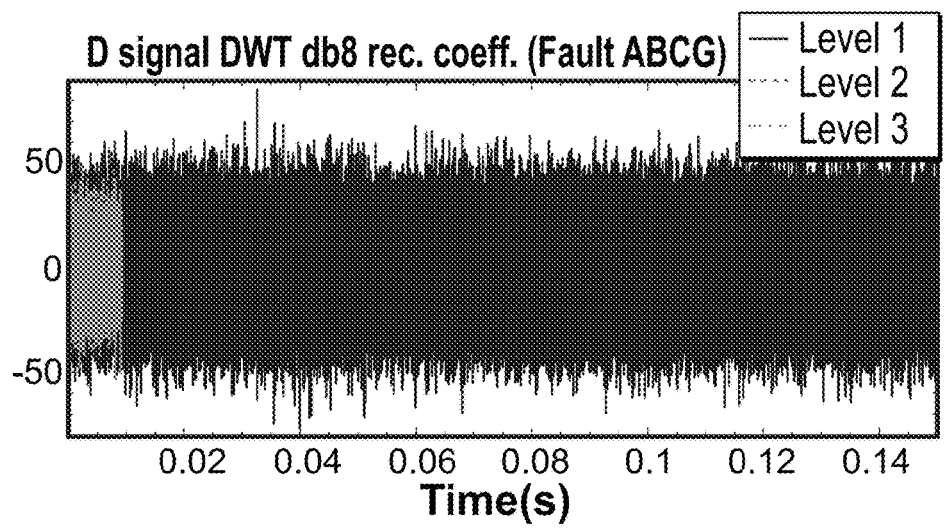
FIG. 24B shows MRA reconstructed coefficients for levels 1-3 according to an embodiment of the disclosure.
Figure 24C:
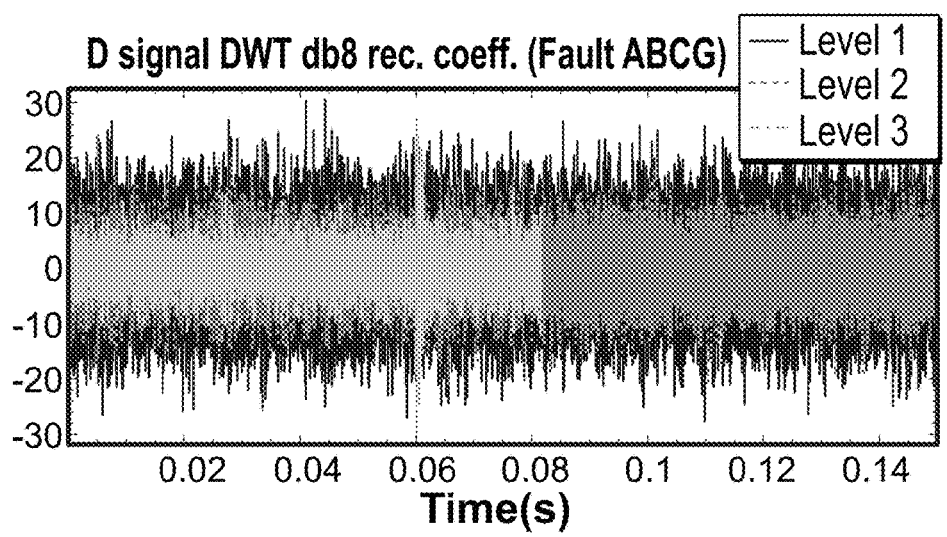
FIG. 24C shows MRA reconstructed coefficients for levels 4-6 according to an embodiment of the disclosure.

The performance of the WT for signals under severe noise conditions were also investigated. Noise was added to the signals of FIG. 4 and the SNR level considered was 20 dB. The DQ0 transform for the noisy signal is shown in FIG. 24A. FIGS. 24B-24C show, respectively, the MRA reconstructed coefficients for the 1-3 and 4-6 levels of decomposition. These result show that under this severe noise conditions, levels 1 to 5 are too noisy to be useful for PQ event detection. Level 6 still shows some higher components mainly at the time when the fault is included. The results for the Q and 0 component signals which produced similar results to those presented were analyzed and are not shown here for brevity.

C. Mathematical Morphology

MM is a technique for analyzing the structure of a given signal.

It was initially developed and applied to two-dimensional signals or images, however, it can also be applied to one-dimensional signals such as those found in power systems. MM require another predefined signal, termed structuring element, to perform its analysis. MM can be considered as a nonlinear type of filtering applied to the input signal. The actual MM operations applied to power systems signals are based on basic MM operations such as opening and closing (which in turn are based on the fundamental erosion and dilation). In particular, the closing-opening-difference operation (CODO) and the close-opening open-closing morphological-gradient (COOCG) transform have been used in power systems signals. This work uses the CODO operation to analyze the power system signals in FIG. 4 with a flat structuring element of 1500 points.

Figure 25A:
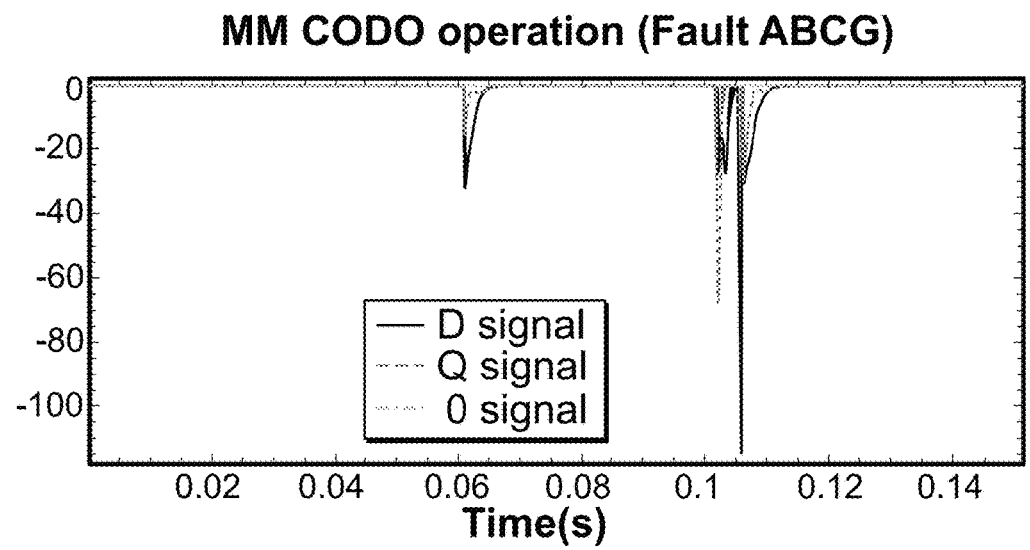
FIG. 25A shows MM CODA operation for the signals in FIG. 23A.
Figure 25B:
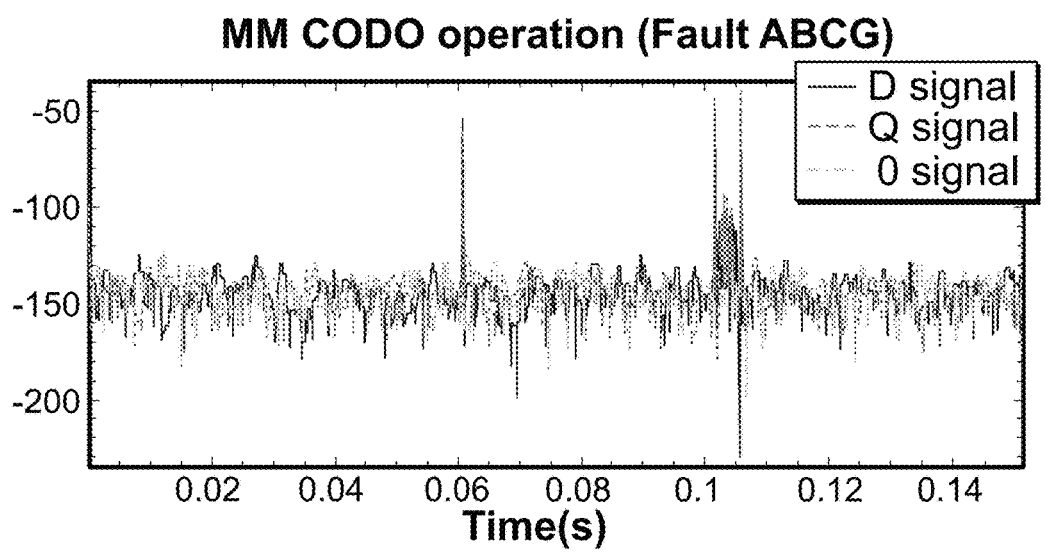
FIG. 25B shows MM CODA operation for the signals in FIG. 24A with an SNR of 20 dB.

Similar to the approach taken in the preceding section for the WT, the first step to analyze power system signals with MM is to apply the DQ0 transform (or any other modal transformation) to the input signals. FIG. 25A shows the results of the MMCODO operation for the signals in FIG. 23A when the structuring element is flat with 1500 points. The results in this figure show that this operation is a useful tool for detecting a PQ event as there is a clear difference between the normal operations and at the fault inception and cleared. This effect is observed for both the D and Q transformed signals. FIG. 25B shows similar results when the input signals are highly contaminated with noise to achieve an SNR of 20 dBs. The results show that even though in steady-state, there is a high volatility in the output due to the noise, there is still a difference at the time of the fault occurrence and clearance. It is important to note that this is in part because the structuring element is large. The selection of the structuring element is crucial to determining the results of the MM operation and it is a matter of research depending on the actual application. The interested reader can check.

D. Result Comparison and Discussion

This section presents a discussion comparing the results of the proposed DMD method with the results of the WT and MM. FIGS. 20, 23, 25A show, respectively, the result of respectively using, the DMD-based proposed method, the WT, and MM to the signals of FIG. 4. These results show that the proposed tool is valid, like the already established WT and MM for PQ event detection. FIGS. 22, 24, 25B show the results when the input signal is affected with noise and has a SNR of 20 dB. The differences under this high noise condition between the two signal conditions, normal operations and faulted, are significantly higher for the proposed method than those of the WT and MM. A difference between the proposed DMD method and MM and the WT is that DMD can be applied to a set of signals instead of only 1-D signals. In fact, the method is suited to be applied to three-phase signals without the need of any additional steps. Another difference between the proposed method and MT and MM is the number of parameters to tune. For the WT, it is the mother wavelet and the level of decomposition, for MM is the structuring element which is defined by the number of points and the weights they have for non-flat structures, for the proposed DMD method, it is the window size. It is important to note that the selection of these parameters is completely dependent on the power systems application and there is no agreed upon consensus in the literature for the mother wavelet in the case of the WT to use or the structuring element in the case of MM.

VIII. Conclusions

The systems and methods disclosed herein provide for a method for detecting power quality events in power system signals based on the DMD. After presenting the theoretical framework of the DMD, the disclosure shows how some of the parameters estimated by this method are significantly different for sets of data with and without a fault. The real part of the estimated eigenvalue is selected as the parameter for disturbance detection and assessment. The disclosed approach is window-based, and the output of the window after DMD is this aforementioned eigenvalue, noted a. This approach can be used for both single and three-phase data sets. The approach is tested with signals containing a wide variety of faulted information. The disclosed systems and methods work for signals with low SNR levels. The disclosure shows how the length of the window affects the performance of the approach. The disclosure compares the proposed method with the Wavelet transform and mathematical morphology showing a better performance under high noise conditions.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for detecting a power quality disturbance, comprising:
monitoring a power signal;
receiving a new data point from a monitored signal;
computing a dynamic mode decomposition of a window of the new data point where the new data point is included in the window and the oldest data point is discarded thereby keeping the window size constant;
obtaining a real-part of eigenvalues from the dynamic mode decomposition;
comparing values of the real-part against a pre-specified threshold and if they meet a set of predetermined criteria then determine an existence of a power quality disturbance and location; and
indicating to a user the power quality disturbance; and
the user taking an action comprising isolating the power quality disturbance location.

2. The method of claim 1, wherein the power quality disturbance is a fault.

3. The method of claim 1, wherein the data point is a voltage.

4. The method of claim 3, wherein the set of signals is a three-phase signal.

5. The method of claim 1, wherein the data point is a current.

6. The method of claim 1, wherein the monitored signal is a set of signals.

7. The method of claim 6, wherein the voltages and currents are monitored simultaneously.

8. The method of claim 1, wherein the power signal is a power transmission in an electrical grid.

9. The method of claim 1, further comprising:
dispatching generators and replacing faulty equipment.

10. A system for detecting a power quality disturbance, comprising:
a monitoring circuit electrically connected to an electrical power;
a transmission that receives data points from a time period of data point windows from the electrical power transmission;

a processor connected to the monitoring circuit that receives the data points, wherein the processor executes commands stored on a non-transitory medium that performs the following steps:

computing the dynamic mode decomposition of a window of the new data point where the new data point is included in the window and the oldest data point is discarded thereby keeping the window size constant;

obtaining a real-part of eigenvalues from the dynamic mode decomposition;

comparing values of the real-part against a pre-specified threshold and if they meet a set of predetermined criteria then determine an existence of a power quality disturbance at a location; and indicating to a user the power quality disturbance; and taking an action comprising isolating the power quality disturbance.

11. The system of claim 10, wherein the power quality disturbance is a fault.

12. The system of claim 10, wherein the data point is a voltage.

13. The system of claim 12, wherein the set of signals is a three-phase signal.

14. The system of claim 10, wherein the data point is a current.

15. The system of claim 10, wherein the monitored signal is a set of signals.

16. The system of claim 15, wherein the data point is voltages and currents that are monitored simultaneously.

17. The system of claim 10, wherein the power signal is a power transmission in an electrical grid.

18. The system of claim 10, further comprising:
a relay or actuator that performs an opening action to disconnect the fault.

19. The system of claim 10, further comprising:
dispatching generators and replacing faulty equipment.

* * * * *